United States Patent
Shinobu

(10) Patent No.: US 7,643,264 B2
(45) Date of Patent: Jan. 5, 2010

(54) POWER SUPPLY CONTROLLER AND METHOD FOR CONTROLLING POWER SUPPLY CIRCUIT

(75) Inventor: Hiroshi Shinobu, Shinagawa-ku (JP)

(73) Assignee: Sony Corporation, Tokyo (JP)

( * ) Notice: Subject to any disclaimer, the term of this patent is extended or adjusted under 35 U.S.C. 154(b) by 201 days.

(21) Appl. No.: 11/134,556

(22) Filed: May 20, 2005

(65) Prior Publication Data

US 2005/0264970 A1     Dec. 1, 2005

(30) Foreign Application Priority Data

May 28, 2004   (JP)   ............................. 2004-159582

(51) Int. Cl.
H02H 9/08      (2006.01)
H02H 3/00      (2006.01)
H02H 3/20      (2006.01)
H02H 3/24      (2006.01)

(52) U.S. Cl. ........................... 361/93.9; 361/89; 361/90
(58) Field of Classification Search ................ 361/93.9
See application file for complete search history.

(56) References Cited

U.S. PATENT DOCUMENTS

| | | | | |
|---|---|---|---|---|
| 4,680,688 A | * | 7/1987 | Inou et al. ................... | 363/21.1 |
| 5,297,014 A | * | 3/1994 | Saito et al. ................ | 363/21.17 |
| 5,767,744 A | * | 6/1998 | Irwin et al. ................. | 330/297 |
| 6,127,741 A | * | 10/2000 | Matsuda et al. ............... | 307/36 |
| 6,314,005 B1 | * | 11/2001 | Nishi et al. .............. | 363/21.08 |
| 6,552,917 B1 | * | 4/2003 | Bourdillon .............. | 363/21.12 |
| 6,813,170 B2 | * | 11/2004 | Yang ....................... | 363/56.09 |
| 2004/0148060 A1 | * | 7/2004 | Lee ............................ | 700/295 |

FOREIGN PATENT DOCUMENTS

| | | |
|---|---|---|
| JP | 56-088516 | 7/1981 |
| JP | 10-124154 | 5/1998 |
| JP | 2001-258242 A | 9/2001 |
| JP | 2002-232280 A | 8/2002 |
| JP | 2003-188660 A | 7/2003 |
| WO | WO 2004/010575 A1 | 1/2004 |

* cited by examiner

Primary Examiner—Albert W Paladini
Assistant Examiner—Dharti H Patel
(74) Attorney, Agent, or Firm—Wolf, Greenfield & Sacks, P.C.

(57) ABSTRACT

A power supply controller includes detection circuits that are provided so as to correspond to a plurality of load circuits performing an operation by power output from a power supply circuit and that detect an overcurrent condition of load currents of the respective load circuits; and a control unit controlling a predetermined operation of the power supply circuit so as to change the amount of power output from the power supply circuit in accordance with detection outputs of the detection circuits.

5 Claims, 15 Drawing Sheets

POWER SUPPLY CONTROLLER AND METHOD FOR CONTROLLING POWER SUPPLY CIRCUIT

CROSS REFERENCES TO RELATED APPLICATIONS

The present invention contains subject matter related to Japanese Patent Application JP 2004-159582 filed in the Japanese Patent Office on May 28, 2004, the entire contents of which are incorporated herein by reference.

BACKGROUND OF THE INVENTION

1. Field of the Invention

The present invention relates to power supply controllers controlling power supply circuits and to methods for controlling the power supply circuits.

2. Description of the Related Art

In order to output audio signals as sound from a speaker, audio apparatuses include a power amplifier circuit for amplifying sound signals and driving the speaker. Such a power amplifier circuit is supplied with power from a power supply circuit and performs amplification.

In many cases, such a power amplifier circuit has an overcurrent protection function. For example, such an overcurrent protection function stops the amplification when the volume of sound to be amplified and output reaches an excessive level and a current whose amount is larger than an acceptable amount keeps flowing in the power amplifier circuit for a predetermined time or more. Thus, destruction of the power amplifier circuit and the speaker due to the excessive amount of current is prevented.

In addition, the power supply circuit has an overcurrent protection function in order to protect the power supply circuit itself. For example, such an overcurrent protection function detects the level of a current corresponding to a load current flowing in a predetermined region of the power supply circuit. When the detected level is a predetermined value or more, the power supply circuit stops supplying power to the load. Thus, destruction of components constituting the power supply circuit due to an overcurrent flowing in accordance with an overload condition is prevented.

Accordingly, since each of a power amplifier circuit and a power supply circuit supplying power to the power amplifier circuit in an audio apparatus has an overcurrent protection function, an overcurrent protection function of a system constituted by the power amplifier circuit and the power supply circuit is further ensured. (See Japanese Unexamined Patent Application Publication Nos. 2004-56254 and 6-269159.)

SUMMARY OF THE INVENTION

However, since an overcurrent protection function of each of a power amplifier circuit and a power supply circuit is provided independently for self protection, for example, the following inconvenience may occur.

Here, for example, a system of a power amplifier circuit compatible with multichannel audio is described. The term "multichannel audio" indicates sound reproduction in which the number of audio channels used is larger than two, that is, left (L) and right (R), as is well known. Multichannel audio is typified by, for example, 5.1-channel surround audio.

Such a system compatible with multichannel audio includes a plurality of power amplifier circuits and a power supply circuit for supplying power to the power amplifier circuits. The number of power amplifier circuits corresponds to the maximum possible number of channels.

In this case, the above-mentioned overcurrent protection function is provided in each of the power amplifier circuits and the power supply circuit, and the maximum output capacity of the power supply circuit is set by taking into consideration the maximum output. The term "maximum output" means the maximum output when amplification is performed for all the channels that can be used for multichannel audio. In addition, a limit value of the total output power is set by taking into consideration a predetermined margin with respect to the maximum output capacity.

Even if sound reproduction using, for example, at most 5.1-channel surround sound (the total number of channels is six) is possible in such a system for multichannel audio, sound reproduction using two channels, that is, L and R stereo, is also possible depending on the sound source. In this case, only two proper power amplifier circuits from among the six power amplifier circuits in a power amplifier circuit section perform amplification.

For sound reproduction using two channels, that is, L and R stereo, as described above, in a system for multichannel audio, when the volume of sound output from the speaker considerably increases, in accordance with the increase, the amount of power used for the power amplifier circuits increases, and the power output from the power supply circuit also increases. When the sound volume increases as described above, power supplied from the power supply circuit to the power amplifier circuits may be excessive from the point of view of the power amplifier circuits.

In other words, in this case, as described above, the limit value of the total output power set in the power supply circuit is determined by taking into consideration preventing the power supply circuit from being destroyed when sound is output with a channel configuration in which the number of channels used is equal to the maximum possible number of channels.

Thus, when the sound volume increases in a state in which amplification is performed for two channels, that is, L and R stereo, as described above, even if the power amplifier circuits are used at the maximum power from the point of view of the power amplifier circuits, the power supply circuit does not reach the limit value of the total output power since the power supply circuit supplies power only to the two power amplifier circuits.

If the sound volume further increases, although the power supply circuit does not reach the maximum output power, the amount of power supplied from the power supply circuit to the power amplifier circuits reaches an excessive level from the point of view of the power amplifier circuits, and excessive currents (load currents) flow in the power amplifier circuits. In this condition, the overcurrent protection function of the power amplifier circuits operates before the overcurrent protection function of the power supply circuit operates. Thus, for example, when reproduction of loud sound is performed, the sound output stops. In other words, in this case, for example, although loud sound can be output for reproduction using a large number of channels, such as 5.1 channels, loud sound stops for reproduction using a small number of channels, such as L and R channels. Thus, users are not satisfied with this operation.

As described above, for example, since an overcurrent protection function provided in each of a power supply circuit and a plurality of load circuits (power amplifier circuits) that is supplied with power from the power supply circuit is designed only for overcurrent protection of that circuit, overcurrent protection of the power supply circuit and overcurrent protection of the load circuits are not in effect at the same time. Thus, as typified by the above-mentioned example, some inconvenience may occur.

According to an embodiment of the present invention, a power supply controller includes detection circuits that are provided so as to correspond to a plurality of load circuits performing an operation by power output from a power supply circuit and that detect an overcurrent condition of load currents of the respective load circuits; and a control unit controlling a predetermined operation of the power supply circuit so as to change the amount of power output from the power supply circuit in accordance with detection outputs of the detection circuits.

According to an embodiment of the present invention, a method for controlling a power supply circuit includes the steps of detecting an overcurrent condition of a load current of each of a plurality of load circuits performing an operation by power output from the power supply circuit; and controlling a predetermined operation of the power supply circuit so as to change the amount of power output from the power supply circuit in accordance with a detection result obtained by the detecting step.

With this structure, in an apparatus including a power supply circuit and a plurality of load circuits receiving power supplied from the power supply circuit, an overcurrent condition of a load current is detected for each of the plurality of load circuits. In accordance with the detection output (detection result) of the overcurrent condition for each of the load circuits, the amount of power output from the power supply circuit to the load circuits is controlled. In other words, the amount of power output from the power supply circuit is controlled in accordance with the condition of a load current detected for each of the load circuits, an overcurrent protection function can operate such that the load circuits and the power supply circuit are associated with each other.

As described above, since an overcurrent protection function operates such that load circuits and a power supply circuit are associated with each other, compared with a known case where load circuits and a power supply circuit each have an independent overcurrent protection function, for example, a further appropriate overcurrent protection function corresponding to an actual operation of a load circuit can be realized.

DESCRIPTION OF THE PREFERRED EMBODIMENTS

Embodiments of the present invention will now be described. A power supply controller according to an embodiment of the present invention is installed in a power amplifier apparatus compatible with multichannel audio. Multichannel audio is typified by, for example, 5.1-channel surround audio. Multichannel audio adopts an audio channel configuration in which the number of audio channels used is larger than two, that is, L and R channels, which is well known.

In general, multichannel-compatible audio apparatuses are capable of performing sound reproduction using audio channels whose number is smaller than or equal to the maximum possible number of audio channels.

For example, when 5.1-channel surround sound is adopted as a maximum possible number of channels, for example, sound reproduction using a four-channel configuration, such as front L, front R, rear L, and rear R, a three-channel configuration, such as L and R stereo and a subwoofer, or a two-channel configuration, such as L and R stereo, is possible.

Figure 1:
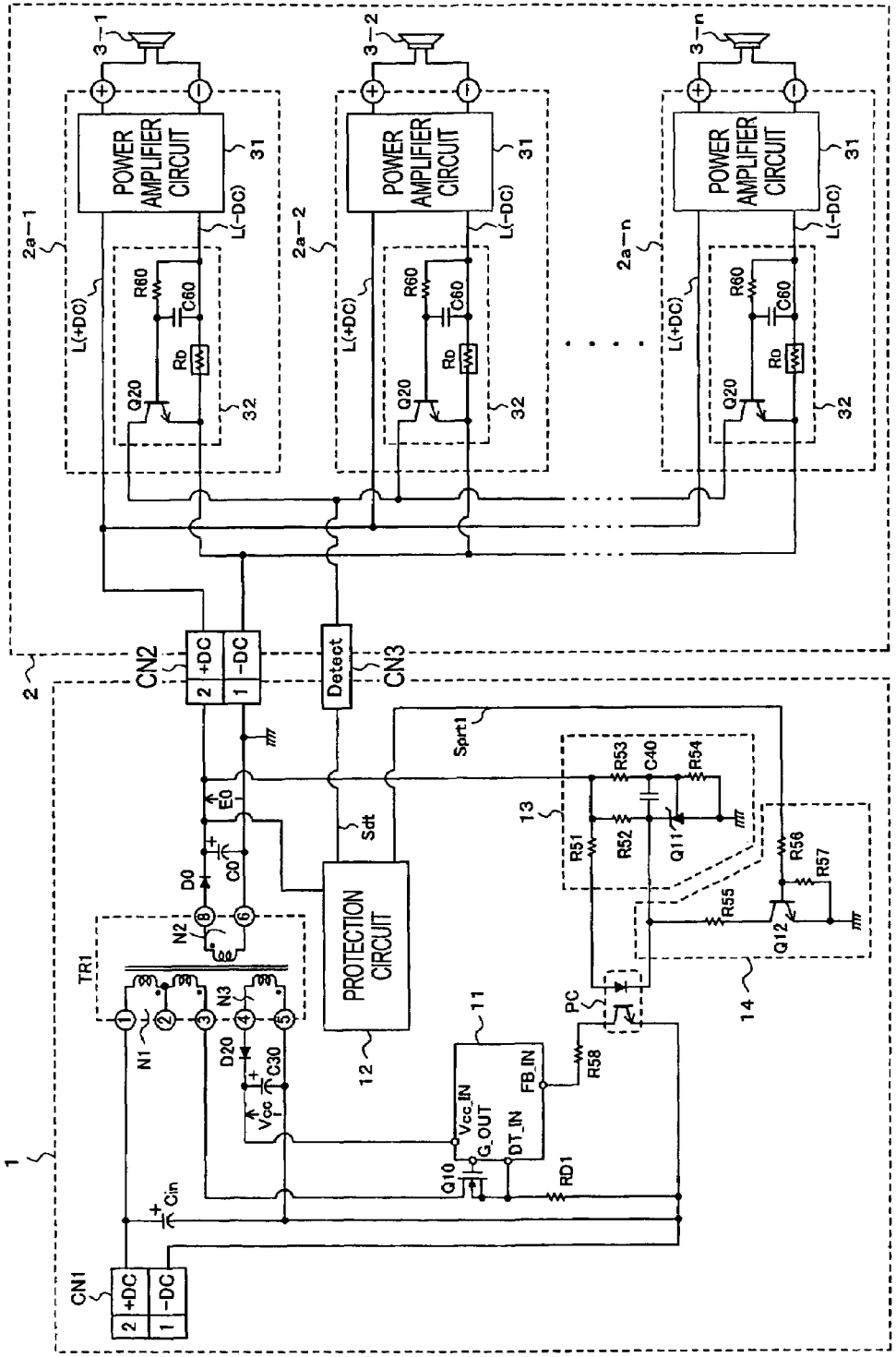
FIG. 1 is a circuit diagram showing an example of the structure of a power amplifier apparatus according to an embodiment of the present invention.

FIG. 1 shows an example of the structure of a power amplifier apparatus according to this embodiment.

The power amplifier apparatus includes a power-supply circuit section 1 and a power amplifier system section 2 that receives power supplied from the power-supply circuit section 1, amplifies sound signals, and outputs the amplified sound signals as sound from speakers.

The power-supply circuit section 1 functions as a switching power supply circuit.

In the power-supply circuit section 1, an input-DC voltage is input from an input connector CN1. This input DC voltage is obtained as a voltage across a smoothing capacitor $C_{in}$.

The smoothing capacitor $C_{in}$ is connected in parallel to a series-connected circuit including a primary winding N1 of a converter transformer TR1, a switching element Q10, and a current-detecting resistor RD1. In this case, metal-oxide semiconductor field effect transistor (MOSFET) is used as the switching element Q10.

A switching drive circuit 11 includes, for example, an integrated circuit (IC) for switching driving.

The switching drive circuit 11 receives a primary DC power supply voltage Vcc as an operation power supply. A driving signal (gate voltage) having an alternating waveform at a predetermined frequency is applied from a terminal G-OUT to the gate of the switching element Q10. Thus, the switching element Q10 receives a voltage (DC input voltage) across the smoothing capacitor $C_{in}$ via the primary winding N1 of the converter transformer TR1, and switches on and off. In other words, by this switching operation, power conversion from DC to AC is performed.

In this case, a tertiary winding N3 is wound around a primary side of the converter transformer TR1. The DC power supply voltage Vcc is obtained by a half-wave rectifier circuit that receives an alternating voltage excited in the tertiary winding N3 and that performs a rectification operation. The half-wave rectifier circuit includes a diode D20 and a capacitor C30 that are connected to the tertiary winding N3, as shown in FIG. 1.

In accordance with the switching operation performed by the switching element Q10, an alternating voltage is obtained at the primary winding N1 of the converter transformer TR1, and the alternating voltage is excited in a secondary winding N2.

In this case, the alternating voltage excited in the secondary winding N2 is rectified and smoothed by a half-wave rectifier circuit constituted by a secondary rectifier diode Do and a secondary smoothing capacitor Co, and a secondary DC output voltage Eo is generated as a voltage across the secondary smoothing capacitor Co. The secondary DC output voltage Eo is supplied to a load via an output connector CN2. Here, the power amplifier system section 2 functions as a load. As described below, the power amplifier system section 2 has a configuration compatible with multichannel audio. The power amplifier system section 2 amplifies an input audio signal for each audio channel, and drives a speaker corresponding to the audio channel. The secondary DC output voltage Eo supplied as described above functions as power for an amplification operation.

In this case, the secondary DC output voltage Eo branches off, and is input to a voltage control circuit 13.

The voltage control circuit 13 includes resistors R51, R52, R53, R54, a capacitor C40, and a shunt regulator Q11 that are connected as shown in FIG. 1. When the secondary DC output voltage Eo rises to a predetermined level, the voltage control circuit 13 causes a current at a level corresponding to the increase in the level to flow to a photodiode of a photocoupler PC.

A collector current corresponding to the level of a current (the amount of light emission) flowing in the photodiode flows in a phototransistor of the photocoupler PC. This collector current is input to a feedback input terminal FB_IN of the switching drive circuit 11 via a resistor R58. In other words, a voltage at a level corresponding to the level of the collector current of the phototransistor is input to the feedback input terminal FB_IN as a feedback signal.

In accordance with the level of the voltage input to the feedback input terminal FB_IN, the switching drive circuit 11 controls the frequency of a driving signal output from the terminal G_OUT. In other words, the switching frequency of the switching element Q10 is controlled. As is generally known, in accordance with a change in the switching frequency, the amount of power transmitted from the primary side to the secondary side changes, and the level of the secondary DC output voltage Eo thus changes. Since the voltage control circuit 13 includes the shunt regulator Q11, the voltage control circuit 13 does not operate when the secondary DC output voltage Eo is at a level below the predetermined level. When the secondary DC output voltage Eo rises to the predetermined level, the voltage control circuit 13 operates such that a feedback signal at a level corresponding to the increase in the level is generated. In accordance with the component of the feedback signal corresponding to the output from the voltage control circuit 13, when the level of the secondary DC output voltage Eo rises to the predetermined level, an operation to prevent the level of the secondary DC output voltage Eo from exceeding the predetermined level is performed.

The photocoupler PC is provided so that a signal is input and output in a state in which the primary side and the secondary side are DC isolated from each other when the signal is transmitted between the primary side and the secondary side of the power-supply circuit section.

The current-detecting resistor RD1 connected in series to the switching element Q10 is provided so as to correspond to an overcurrent protection function that is provided independently for the power-supply circuit section 1. In other words, the voltage across the current-detecting resistor RD1 rises to a predetermined level in accordance with an excessive current flowing in the switching element Q10, and the voltage across the current-detecting resistor RD1 is input to an overcurrent-detecting terminal DT_IN of the switching drive circuit 11. In response to this, for example, the switching drive circuit 11 stops outputting a driving signal for switching driving the switching element Q10. Accordingly, the switching operation of the switching element Q10 in the power-supply circuit section 1 stops, and components, such as the switching element Q10, constituting the power-supply circuit section 1 can be protected.

The overcurrent protection function is set to operate in accordance with, for example, a load short-circuit condition. The overcurrent protection function does not operate in a normal state in which overcurrent protection is performed by a protection circuit 12.

In the power-supply circuit section 1 according to this embodiment, the protection circuit 12 is provided.

As shown in FIG. 1, a current-detecting signal Sdt is input to the protection circuit 12 from the power amplifier system section 2 via contact connection by a detection signal connector CN3.

In accordance with the input current-detecting signal Sdt, the protection circuit 12 outputs a protection signal Sprt1 for overcurrent protection to an amplifier circuit 14. The internal structure and the operation of the protection circuit 12 will be described below.

The amplifier circuit 14 includes a PNP transistor Q12, resistors R55, R56, and R57 that are connected as shown in FIG. 1. When the protection signal Sprt1 at a predetermined level is input, the amplifier transistor Q12 amplifies the protection signal Sprt1 and causes a collector current to flow to the photodiode via the resistor R55. Thus, the feedback signal corresponding to the level of the secondary DC output voltage Eo from the voltage control circuit 13 and a feedback signal corresponding to the level of the protection signal Sprt1 are combined and input to the feedback input terminal FB_IN of the switching drive circuit 11.

In accordance with the component of the feedback signal corresponding to the level of the protection signal Sprt1, the switching drive circuit 11 controls the switching frequency such that the amount of power transmitted from the primary side to the secondary side reduces in accordance with the level. Changing the amount of power transmitted from the primary side to the secondary side means changing the amount of power (the amount of output power) output to the power amplifier system section 2, which functions as a load of the power-supply circuit section 1.

The power amplifier system section 2 includes power amplifier circuits for amplifying sound signals and outputting the amplified sound signals from speakers. In this embodiment, the power amplifier system section 2 corresponds to a predetermined multichannel configuration. The power amplifier system section 2 includes a predetermined number of power amplifier units 2a from a first power amplifier unit 2a-1 to an n-th power amplifier unit 2a-n, as shown in FIG. 1, so that the power amplifier system section 2 can be compatible with the multichannel configuration. The number of power amplifier units 2a corresponds to the maximum possible number of audio channels. More specifically, if the maximum possible number of audio channels corresponds to 5.1-channel surround sound, the total number of channels is six, and six power amplifier units, that is, the first power amplifier unit 2a-1 to the sixth power amplifier unit 2a-6, are provided. The first power amplifier unit 2a-1 to the sixth power amplifier unit 2a-6 receive and amplify sound signals of front left (FL), front right (FR), center (C), surround left (SL), surround right (SR), and subwoofer (SW) channels, respectively.

As shown in FIG. 1, the power amplifier units from the first power amplifier unit 2a-1 to the n-th power amplifier unit 2a-n have the same internal structure.

Each of the first power amplifier unit 2a-1 to the n-th power amplifier unit 2a-n includes a power amplifier circuit 31 and a current-detecting circuit 32. The power amplifier circuit 31 receives the secondary DC output voltage Eo as a power source, which is supplied from the power-supply circuit section 1 via the output connector CN2. The secondary DC output voltage Eo is input to the power amplifier circuit 31 via a positive power-supply input line L(+DC) and a negative power-supply input line L(−DC) that are connected to the output connector CN2. The positive power-supply input line L(+DC) is connected to the positive pole of the secondary DC output voltage Eo (a positive terminal of the secondary smoothing capacitor Co) via the output connector CN2, and the negative power-supply input line L(−DC) is connected to the negative pole of the secondary DC output voltage Eo (a negative terminal of the secondary smoothing capacitor Co) via the output connector CN2. A current-detecting resistor RD of the current-detecting circuit 32 is provided in the negative power-supply line L(−DC).

In this case, the positive power-supply input line L(+DC) and the negative power-supply input line L(−DC) of each of the first power amplifier unit 2a-1 to the n-th power amplifier unit 2a-n are connected to the positive pole and the negative pole, respectively, of the secondary DC output voltage Eo via the output connector CN2. This means that the secondary DC output voltage Eo is connected in parallel to power inputs to the first power amplifier unit 2a-1 to the n-th power amplifier unit 2a-n.

In addition, although not illustrated, an audio signal corresponding to a predetermined audio channel is input from, for example, a preamplifier unit to each of the first power amplifier unit 2a-1 to the n-th power amplifier unit 2a-n. In addition, as shown in FIG. 1, speakers 3-1 to 3-n are connected to speaker terminals. For example, in practice, each of the speakers 3-1 to 3-n corresponds to a reproduction frequency band of the corresponding audio channel.

The first power amplifier unit 2a-1 to the n-th power amplifier unit 2a-n amplify input audio signals using the secondary DC output voltage Eo input as described above as a power source, and output drive currents to the corresponding speakers 3-1 to 3-n. Thus, each of the speakers 3-1 to 3-n outputs real sound of a corresponding audio channel.

The internal structure of each of the first power amplifier unit 2a-1 to the n-th power amplifier unit 2a-n is not particularly limited. For example, an analog amplifier that receives an analog audio signal and that amplifies the received analog audio signal or a digital amplifier that receives a digital audio signal (pulse width modulation (PWM) signal) and that amplifies the received digital audio signal may be used. Furthermore, the system adopted for an analog amplifier or a digital amplifier is not particularly limited. In addition, the power amplifier units from the first power amplifier unit 2a-1 to the n-th power amplifier unit 2a-n may not have completely the same structure. For example, the first power amplifier unit 2a-1 to the n-th power amplifier unit 2a-n may have different structures such that each power amplifier unit corresponds to the reproduction frequency band, the type of reproduction sound, and the like of a corresponding audio channel.

The current-detecting circuit 32 in each of the first power amplifier unit 2a-1 to the n-th power amplifier circuit 2a-n detects the state of a current of power input to the power amplifier circuit 31 of each power amplifier unit. As shown in FIG. 1, the current-detecting circuit 32 includes the current-detecting resistor RD, a transistor Q20, a resistor R60, and a capacitor C60.

The current-detecting resistor RD is provided in series with the negative power-supply input line L(−DC). In this case, the negative power-supply input line L(−DC) is connected to the negative pole of the secondary DC output voltage Eo (the negative pole of the secondary smoothing capacitor Co) via the output connector CN2. The negative pole is originally a ground potential, as can be understood from the connection between the negative pole and the ground on the secondary side in the power-supply circuit section 1. By arranging the current-detecting resistor RD as shown in FIG. 1, a voltage corresponding to the level of a current flowing in accordance with power necessary for the corresponding power amplifier circuit 31 to perform amplification is generated across the current-detecting resistor RD. In other words, the level of a load current flowing to a power amplifier unit functioning as a load from the point of view of the power-supply circuit section 1 is detected as the voltage.

In the current-detecting circuit 32, the base of the PNP transistor Q20 is connected to a portion of the negative power-supply input line L(−DC) between the input terminal of the power amplifier circuit 31 and the current-detecting resistor RD via a parallel circuit of the resistor R60 and the capacitor C60. The emitter of the transistor Q20 is connected to a portion of the negative power-supply input line L(−DC) (ground potential) between the output connector CN2 and the current-detecting resistor RD. The collector of the transistor Q20 is connected to a line for the current-detecting signal Sdt of the protection circuit 12 in the power-supply circuit section 1 via the detection signal connector CN3. In this case, the collectors of the transistors Q20 of the power amplifier units from the first power amplifier unit 2a-1 to the n-th power amplifier unit 2a-n are connected to the detection signal connector CN3. In other words, in this case, the current-detecting signal Sdt input to the protection circuit 12 is obtained by combining outputs of the collectors of the transistors Q20 of the power amplifier units from the first power amplifier unit 2a-1 to the n-th power amplifier unit 2a-n.

The operation of the current-detecting circuit 32 arranged as described above is described next.

As described above, the level of a current (a load current) input from the power source (the secondary DC output voltage Eo) to the power amplifier circuit 31 is detected as the voltage across the current-detecting resistor RD.

Here, one end of the current-detecting resistor RD is connected to the emitter of the transistor Q20, and the other end of the current-detecting resistor RD is connected to the base of the transistor Q20 via parallel connection of the resistor R60 and the capacitor C60.

Accordingly, for example, if the voltage across the current-detecting resistor RD increases in accordance with an increase in the current flowing in the negative power-supply input line L(−DC), the voltage VBE between the base and emitter of the transistor Q20 increases, and the collector current of the transistor Q20 thus increases. Since the time-constant capacitor C60 is provided in parallel with the base resistor R60, a change in the collector current of the transistor Q20 is delayed with respect to the change in the voltage across the current-detecting resistor RD. Thus, for example, an instantaneous change in the level of the load current or the like is accommodated, and malfunction is thus prevented.

The collector current of the transistor Q20 is input to the protection circuit 12 of the power-supply circuit section 1 as the current-detecting signal Sdt, which is an output of the current-detecting circuit 32, via the detection signal connector CN3. Since, as described above, the collectors of the transistors Q20 of the power amplifier units from the first power amplifier unit 2a-1 to the n-th power amplifier unit 2a-n are connected to the detection signal connector CN3, the current-detecting signal Sdt input to the protection circuit 12 is obtained by combining detection outputs (collector currents of the transistors Q20) obtained by the power amplifier units from the first power amplifier unit 2a-1 to the n-th power amplifier unit 2a-n.

The protection circuit 12 performs overcurrent protection in accordance with the current-detecting signal Sdt obtained as described above.

Figure 2:
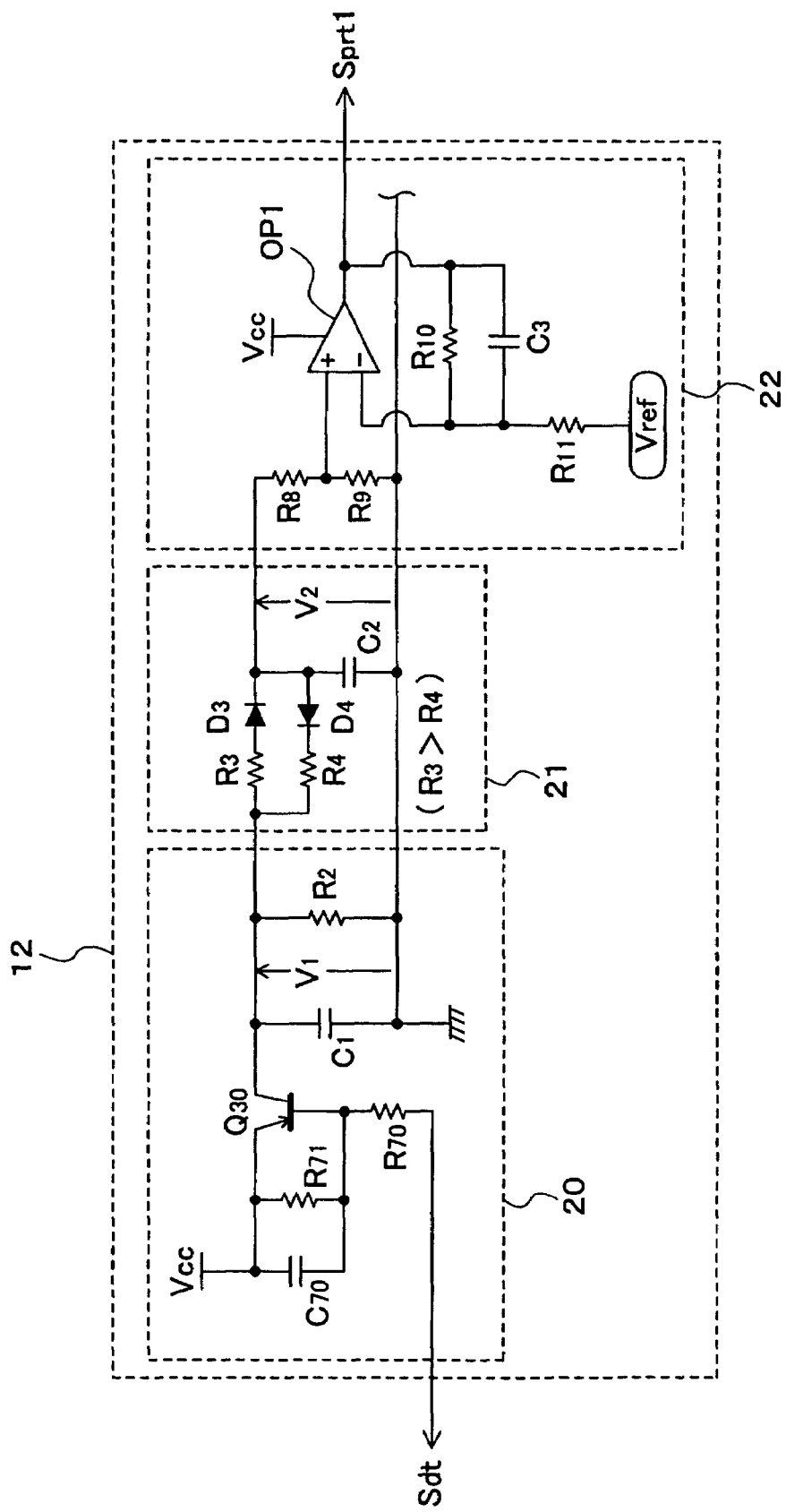
FIG. 2 is a circuit diagram showing a first example of the structure of a protection circuit provided in a power supply circuit according to the embodiment.

FIG. 2 shows a first example of the internal structure of the protection circuit 12. The structure shown in FIG. 2 is the most basic internal structure of the protection circuit 12.

As shown in FIG. 2, the protection circuit 12 includes an overcurrent-detecting circuit 20, a time-constant circuit 21, and a signal output circuit 22.

The overcurrent-detecting circuit 20 includes a PNP transistor Q30, a base-emitter resistor R71, a capacitor C70, a current-detecting resistor R2, and a current-detecting capacitor C1.

The emitter of the transistor Q30 is connected to the DC voltage Vcc, and the base of the transistor Q30 is connected to a line for the current-detecting signal Sdt via a base resistor R70. A parallel circuit of the resistor R71 and the capacitor C70 is connected between the base and emitter of the transistor Q30.

The collector of the transistor Q30 is connected to one end of the current-detecting capacitor C1. The other end of the current-detecting capacitor C1 is connected to ground. The resistor R2 is connected in parallel to the current-detecting capacitor C1.

The time-constant circuit 21 is provided downstream of the overcurrent-detecting circuit 20 arranged as described above. The time-constant circuit 21 includes resistors R3 and R4, diodes D3 and D4, and a time-constant capacitor C2.

In the time-constant circuit 21, a series-connected circuit of the resistor R3 and the diode D3 is connected in parallel to a series-connected circuit of the resistor R4 and the diode D4. In this case, the anode of the diode D3 is connected to the resistor R3, and the cathode of the diode D4 is connected to the resistor R4. The connection point between the resistor R3 and the resistor R4 in the parallel-connected circuit is connected to a connection point between the resistor R2 and the current-detecting capacitor C1 of the overcurrent-detecting circuit 20. The connection point between the cathode of the diode D3 and the anode of the diode D4 is connected to one terminal of positive and negative terminals of the time-constant capacitor C2. The other terminal of the positive and negative terminals of the time-constant capacitor C2 is connected to the ground on the primary side. In this connection state, the diode D3 and the diode D4 are arranged in the opposite direction from each other. The series-connected circuit of the resistor R3 and the diode D3 functions as a charging path used for charging of the time-constant capacitor C2, and the series-connected circuit of the resistor R4 and the diode D4 functions as a discharging path used for discharging of the time-constant capacitor C2.

The signal output circuit 22 includes an operational amplifier OP1, voltage-dividing resistors R8 and R9, a feedback resistor R10, a capacitor C3, and a resistor R11.

The voltage-dividing resistors R8 and R9 that are connected in parallel to the time-constant capacitor C2 divide a voltage V2 across the time-constant capacitor C2. The voltage division point between the voltage-dividing resistors R8 and R9 is connected to a non-inverting input terminal of the operational amplifier OP1. Thus, a voltage at a level obtained by dividing the voltage V2 across the time-constant capacitor C2 is input to the non-inverting input terminal of the operational amplifier OP1.

Since a reference voltage Vref at a predetermined level is connected to an inverting input terminal of the operational amplifier OP1 via the resistor R11, a threshold voltage level obtained by subtracting a voltage drop due to the resistor R11 from the reference voltage Vref is input to the inverting input terminal of the operational amplifier OP1.

A parallel circuit of the feedback resistor R10 and the capacitor C3 is connected between the output terminal and the inverting input terminal of the operational amplifier OP1.

In this case, the operational amplifier OP1 receives the power supply voltage Vcc and operates. Although not shown in FIG. 1, for example, the power supply voltage Vcc is generated on the secondary side of the power-supply circuit section 1 shown in FIG. 1. The operational amplifier OP1 outputs the protection signal Sprt1. As described below, in accordance with a period during which the protection signal Sprt1 is at an "H" level, a control operation to restrict the amount of transmitted power is performed as a protection operation. In other words, by generating a protection signal Sprt1 at the "H" level, a control time for controlling the amount of transmitted power is set.

Figure 3:
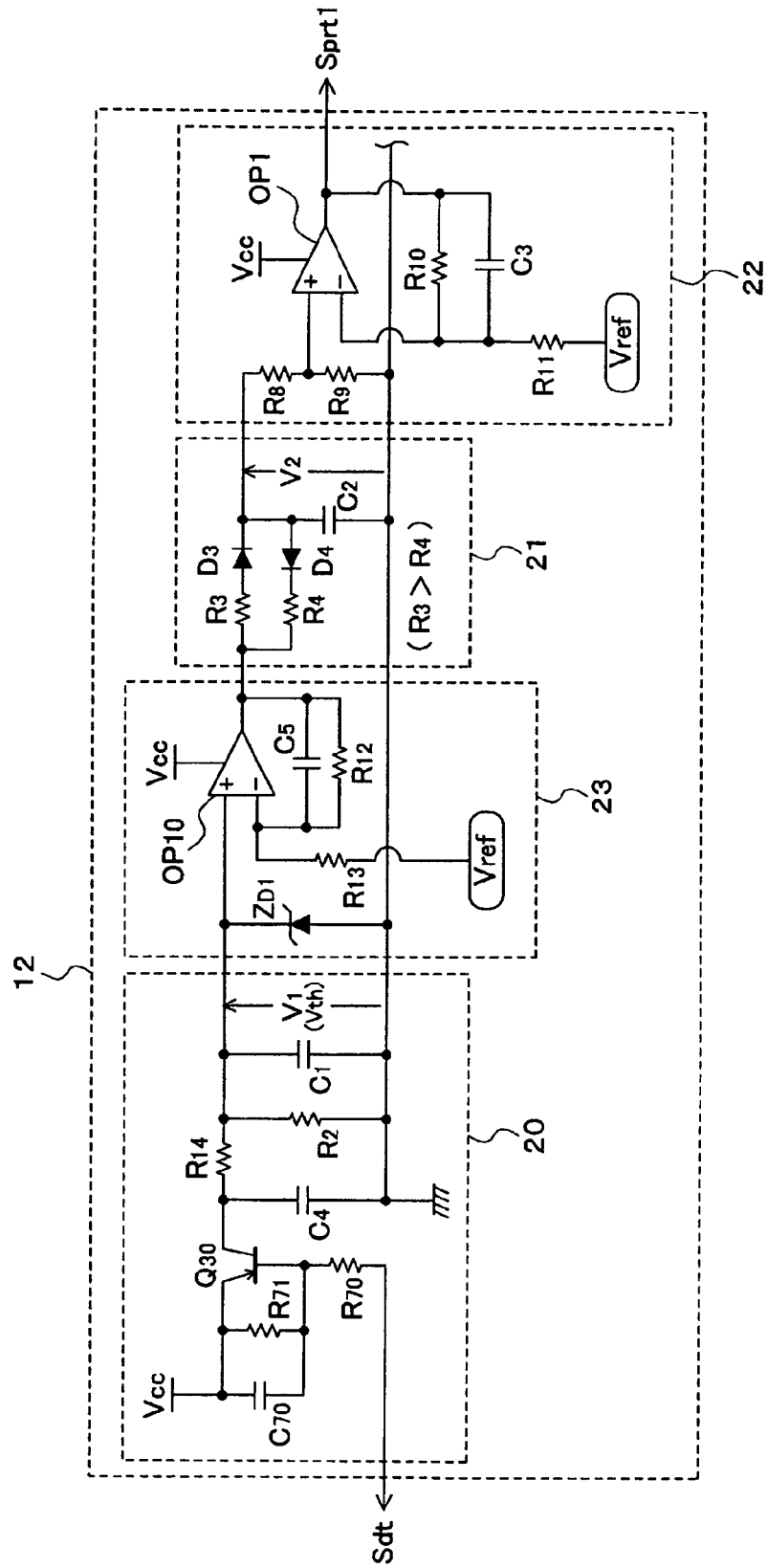
FIG. 3 is a circuit diagram showing a second example of the structure of the protection circuit provided in the power supply circuit according to the embodiment.

FIG. 3 shows a second example of the structure of the protection circuit 12. In FIG. 3, the same parts as in FIG. 2 are referred to with the same reference numerals and the descriptions of these same parts will be omitted here.

In FIG. 3, a current-detecting capacitor C4 and a current-detecting resistor R14 are added to the overcurrent-detecting circuit 20. The current-detecting capacitor C4 is connected between the collector of the transistor Q30 and the ground. The connection point between the current-detecting capacitor C4 and the collector of the transistor Q30 is connected to one end of the resistor R14. A parallel-connected circuit of the current-detecting capacitor C1 and the resistor R2 is connected between the other end of the resistor R14 and the ground on the primary side.

In this case, an amplifier circuit 23 including an operational amplifier OP10 is provided between the overcurrent-detecting circuit 20 and the time-constant circuit 21.

In the amplifier circuit 23, the operational amplifier OP10 receives a DC power supply voltage Vcc and operates. A non-inverting input terminal of the operational amplifier OP10 is connected to a positive terminal of the current-detecting capacitor C1 of the overcurrent-detecting circuit 20. An inverting input terminal of the operational amplifier OP10 is connected to a reference voltage Vref via a resistor R13.

A parallel-connected circuit of a feedback resistor R12 and a capacitor C5 is connected between the output and the inverting input terminal of the operational amplifier OP10.

The output terminal of the operational amplifier OP10 is connected to the connection point of the resistors R3 and R4 of the time-constant circuit 21.

A Zener diode ZD1 is connected between the non-inverting input terminal of the operational amplifier OP10 and the ground on the primary side. Since, as described below, the voltage V1 across the current-detecting capacitor C1 corresponds to the level of a load current, the voltage V1 exhibits a properly excessive level in accordance with an overcurrent condition. When an excessive level is input to the non-inverting input terminal of the operational amplifier OP10, the Zener diode ZD1 protects the operational amplifier OP10 by clamping the level.

Figure 4:
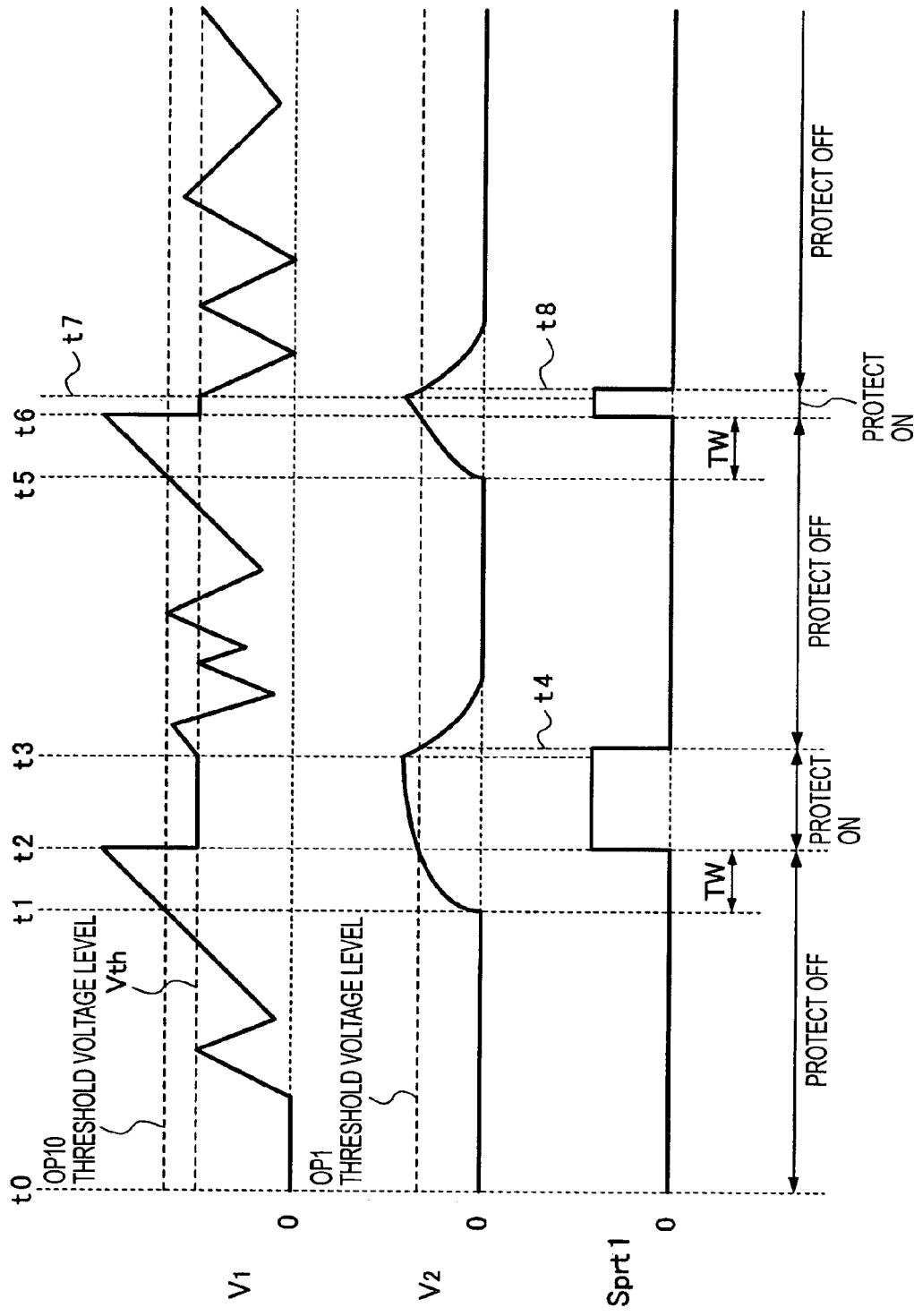
FIG. 4 is a timing chart showing an example of the operation of the protection circuit shown in FIG. 3.

FIG. 4 is a timing chart (wave-form chart) showing an example of the operation of the protection circuit 12 having the structure shown in FIG. 3. The protection circuit 12 having the structure shown in FIG. 2 also operates basically as shown by the timing chart in FIG. 4.

When the power amplifier circuits 31 of the power amplifier units from the first power amplifier unit 2a-1 to the n-th power amplifier unit 2a-n in the power amplifier system section 2 amplify input sound signals, the current-detecting circuits 32 of the power amplifier units from the first power amplifier unit 2a-1 to the n-th power amplifier unit 2a-n operate as described below.

When the amplification factors for the amplification operations of the power amplifier circuits 31 change in order to increase the volume of sound to be output from speakers, in accordance with the change, the power amplifier circuits 31 need a larger amount of power. In order to obtain the larger amount of power, a larger amount of current is input from the power source (the secondary DC output voltage Eo) supplied from the power-supply circuit section 1. In the current-detecting circuits 32, in accordance with the increase in the levels of the currents, the voltages across the current-detecting resistors RD increase. Also, in accordance with the increase in the voltages, the levels of the collector currents flowing in the collectors of the transistors Q20 increase. Accordingly, the levels of the collector currents of the transistors Q20 correspond to the amounts of power (load power) used for the power amplifier circuits 31. As shown in FIG. 1, a current-detecting signal Sdt is obtained by combining the collector currents. Thus, in this case, for the power-supply circuit section 1, the current-detecting signal Sdt represents the load power (the level of the load current) when the entire power amplifier system section 2 is regarded as one load.

As described above, the current-detecting signal Sdt having the level corresponding to the load power of the power amplifier system section 2 flows to the base of the transistor Q30 via the base resistor R70 in the overcurrent-detecting circuit 20 shown in FIG. 3. In accordance with this, the transistor Q30 performs amplification and causes a collector current at a level corresponding to the current-detecting signal Sdt to flow. In addition, the capacitor C70 provided between the base and emitter of the transistor Q30 has a predetermined time constant, thus preventing generation of a collector output of the transistor Q30 including noise (malfunction) based on an instantaneous current-detecting signal Sdt.

The collector current of the transistor Q30 is first applied to the current-detecting capacitor C4. Thus, a voltage corresponding to the level of the collector current of the transistor Q30 is obtained across the current-detecting capacitor C4. In other words, a voltage corresponding to the level of the current-detecting signal Sdt is obtained. The voltage across the current-detecting capacitor C4 is divided by the resistors R14 and R2, and is input to the current-detecting capacitor C1. Charging and discharging by the applied voltage generates the voltage V1 across the current-detecting capacitor C1.

Charging and discharging of the current-detecting capacitor C1 is based on the voltage corresponding to the level of the current-detecting signal Sdt. Thus, the voltage V1 across the current-detecting capacitor C1 changes in accordance with the amount of power (the amount of current flowing to the power amplifier circuits 31) for driving speakers in the power amplifier system section 2. In other words, the voltage V1 across the current-detecting capacitor C1 represents a change in load power (load current) in the power amplifier system section 2 as a change in the DC level.

For the circuit structure shown in FIG. 3, the voltage V1 across the current-detecting capacitor C1 is input to the amplifier circuit 23. In the amplifier circuit 23, the operational amplifier OP10 amplifies the voltage V1 across the current-detecting capacitor C1 and outputs the amplified voltage. Amplification by the operational amplifier OP10 improves the S/N ratio of a current-detecting signal, which is the voltage V1 across the current detection capacitor C1, input to the time-constant circuit 21.

For an understandable explanation, the operational amplifier OP10 in this case is regarded as operating as a comparator. The operational amplifier OP10 outputs an "L" level if the voltage V1, which is input to the non-inverting input terminal of the operational amplifier OP10, is less than a threshold level of a voltage input to the inverting input terminal of the operational amplifier OP10. The operational amplifier OP10 outputs an "H" level of a predetermined potential if the voltage V1, which is input to the non-inverting input terminal of the operational amplifier OP10, is equal to or more than the threshold level. In FIG. 4, the voltage V1 rises to the threshold voltage level at time t1. The state in which the voltage V1 is equal to or more than the threshold voltage level is, for example, a state in which load power is regarded as being at the peak, that is, a load current is in an overcurrent condition.

Such a state corresponds to a state in which loud sound is output from speakers so that the load power of the entire power amplifier system section 2 is in an overload condition. This state occurs when a sound signal having a larger amplitude is input or when the sound volume is controlled such that louder sound is output. More specifically, since the current-detecting signal Sdt is equivalent to a level obtained by combining the levels of load currents flowing in the power amplifier circuits 31 of the power amplifier units 2a, the overcurrent condition includes a case where a load power state of the power amplifier circuit 31 corresponding to at least one audio channel is in an overcurrent condition. The overcurrent condition also includes a case where the combined value (added value) of load currents of a plurality of power amplifier circuits 31 corresponding to a plurality of audio channels increases such that the entire power amplifier system section 2 is regarded as being in an overcurrent condition.

The threshold voltage level of the operational amplifier OP10 can be set by determining the relationship between the level of the reference voltage Vref and the resistance of the resistor R13 in accordance with the level of the voltage V1 corresponding to the overcurrent condition, as described above.

When the voltage V1 rises to the threshold voltage level at time t1, the operational amplifier OP10 starts outputting the "H" level. The output of the operational amplifier OP10 charges the time-constant capacitor C2 via a charging path from the resistor R3 to the diode D3 in the time-constant circuit 21. In other words, at time t1, charging of the time-constant capacitor C2 starts.

Starting the charging of the time-constant capacitor C2 increases a voltage V2 across the time-constant capacitor C2 from the 0 level. The voltage V2 has a waveform in which the voltage increases with a gradient corresponding to the time constant of the resistor R3 and the capacitance of the time-constant capacitor C2.

From time t1, the charging of the time-constant capacitor C2 by the operational amplifier OP10 outputting the "H" level is maintained in accordance with a state in which the current-detecting signal Sdt has a level corresponding to an overcurrent condition. Thus, for example, if it is detected that the overcurrent condition ends at a point in time before time t2 (in other words, within a standby time Tw), the operational amplifier OP10 stops outputting the "H" level at this point in time. Thus, charging of the time-constant capacitor C2 stops, and a discharging operation starts. As a result, a protect-off state is maintained and does not change to a protect-on state.

In this case, the voltage V2 across the time-constant capacitor C2 is divided by the voltage-dividing resistors R8 and R9 in the signal output circuit 22 and is input to the non-inverting input terminal of the operational amplifier OP1. The operational amplifier OP1 compares the level of the voltage V2, which is input to the non-inverting input terminal of the operational amplifier OP1, with a predetermined threshold level of a voltage input to the inverting input terminal of the operational amplifier OP1, as shown in FIG. 4. The level obtained by dividing the voltage V2 by the voltage-dividing resistors R8 and R9 is used for comparison with the threshold voltage level of the operational amplifier OP1.

When the operational amplifier OP1 in this case is regarded as operating as a comparator, the operational amplifier OP1 outputs an "L" level if the voltage V2 across the time-constant capacitor C2 is less than the threshold voltage level, and the operational amplifier OP1 outputs an "H" level of a predetermined potential if the voltage V2 is equal to or more than the threshold voltage level. In FIG. 4, at time t2, an output of the operational amplifier OP1 rises to the "H" level due to an increase of the voltage V2 across the time-constant capacitor C2 to reach the threshold voltage level.

The output of the operational amplifier OP1 at the "H" level serves as an effective protection signal Sprt1. The protection signal Sprt1 is input to the feedback input terminal FB_IN of the switching drive circuit 11 via the amplifier circuit 14, the photocoupler PC, and the resistor R58, in that order.

In accordance with reception of the protection signal Sprt1, the switching drive circuit 11 reduces the amount of power transmitted from the primary side to the secondary side by controlling the switching frequency. The amount of reduction in the transmitted power is determined in accordance with a level input to the feedback input terminal FB_IN, the input level corresponding to the level of the protection signal Sprt1. In accordance with the protection signal Sprt1, the amount of transmitted power is controlled such that the voltage V1 across the current-detecting capacitor C1 is a level less than a predetermined limit level Vth, as shown at time t2 and later in FIG. 4. This means that the amount of transmitted power is controlled to be less than a predetermined value. The amount of transmitted power corresponding to the voltage V1 at a level less than the limit level Vth is smaller than a peak load power. In addition, even if the power amplifier system section 2 keeps operating with this amount of transmitted power, prevention of destruction of the circuit can be ensured. The controlled state from time t2 is regarded as being an effective protect-on state.

As described above, the duration of the standby time Tw, which is a period from time t1 at which the overcurrent condition is detected to time t2 at which the protect-on state starts, is determined in accordance with the time constant of the time-constant capacitor C2 and the resistor R3 for the charging path. In this case, the duration of the standby time Tw is fixed.

As described above, the charging of the time-constant capacitor C2 is performed until the level of the current-detecting signal Sdt drops to a level at which the overcurrent condition ends. Thus, the duration of the protect-on state, which is shown by the period from time t2 to t3 in FIG. 4, corresponds to an overcurrent detection duration starting from time t2.

As shown in FIG. 4, the limit level Vth is set to be less than the threshold voltage level of the operational amplifier OP10. Thus, when the load current level is reduced (when the sound volume is reduced) and the overcurrent condition ends in the protect-on state, the operational amplifier OP10 outputs the "L" level at time t3 in FIG. 4. In response to this, charging of the time-constant capacitor C2 stops. Instead of stopping charging of the time-constant capacitor C2, the time-constant capacitor C2 starts discharging at time t3. The discharging operation is performed via the discharging path from the diode D4 to the resistor R4 in accordance with the output of the operational amplifier OP10 at the "L" level. The discharging time is determined in accordance with the time constant of the time-constant capacitor C2 and the resistor R4. The resistance of the resistor R3 constituting the charging path and the resistance of the resistor R4 constituting the discharging path are set so as to satisfy the condition R3>R4. Thus, as shown in FIG. 4, the waveform of the voltage V2 of the time-constant capacitor C2 exhibits a greater gradient in the discharging time compared with the charging time. As a result, the shift from the protect-on state in which the protection operation is in effect to the protect-off state in which the protection operation is not in effect reacts to the state of the load current more quickly than the shift from the protect-off state to the protect-on state. This can also be understood from the fact that the period from time t3 to time t4 is shorter than the period from time t1 to time t2.

The voltage V2 reduces due to discharging of the time-constant capacitor C2 at time t3, as described above, and the voltage V2 drops to a level less than the threshold voltage level of the operational amplifier OP1 at time t4. Thus, at time t4, the operational amplifier OP1 outputs the "L" level. In other words, outputting of a protection signal Sprt1 stops, and the protect-off state starts. Here, the sound volume output from speakers is below a predetermined level, and the overcurrent condition ends.

The sound volume increases, for example, by receiving a sound signal with a large amplitude or by performing an operation to increase the sound volume, and it is detected that the overcurrent condition starts at time t5. In other words, the voltage V1 across the current-detecting capacitor C1 rises to the threshold voltage level of the operational amplifier OP10. Charging of the time-constant capacitor C2 starts at time t5, as in the case for time t1. In this case, at time t6, that is, after the passage of the standby time Tw from time t5, the voltage V2 across the time-constant capacitor C2 rises to the threshold voltage level of the operational amplifier OP1 and the protection signal Sprt1 is output, as in the case for time t2. At time t6, the protect-on state starts.

In this case, after shifting to the protect-on state at time t6, an overcurrent condition is not detected at time t7. The period from time t6 to time t7 is shorter than the period from time t2 to time t3. Thus, the duration of the protect-on state between time t6 and time t7 is shorter than the duration of the protect-on state between time t2 and time t3.

At time t7, discharging of the time-constant capacitor C2 starts. Since the discharging time is determined in accordance with the discharging time by the resistor R4 and the time-constant capacitor C2, a falling waveform of the voltage V2 from time t7 is the same as the waveform of the voltage V2 from time t3. At time t8, that is, after the passage of a predetermined time from time t7, the voltage V2 drops to a level less than the threshold voltage level of the operational amplifier OP1. Thus, outputting of a protection signal Sprt1 stops, and the protect-off state starts. The duration of the period from time t6 at which discharging of the time-constant capacitor C2 starts to time t7 at which the voltage V2 drops to a level less than the threshold voltage level of the operational amplifier OP1 is determined in accordance with the time constant for the discharging time, and the duration of the period from time t6 to time t7 is equal to the duration of the period from time t3 to time t4.

The first example of the structure of shown in FIG. 2 does not include the amplifier circuit 23 including the operational amplifier OP10. However, when the overcurrent-detecting circuit 20 detects an overcurrent condition, the voltage across the current-detecting capacitor C1 rises to the predetermined level. This triggers charging of the time-constant capacitor C2 via the resistor R3 and the diode D3. Thus, an operation similar to that shown in FIG. 4 can also be achieved by the operation of the protection circuit 12 shown in FIG. 2.

A third example of the protection circuit 12 is described next with reference to FIG. 5. The same parts as in FIGS. 2 and 3 are referred to with the same reference numerals and the descriptions of these same parts will be omitted here.

In the third example, a series-connected circuit of a diode D5 and a resistor R15 is provided between the output terminal and the non-inverting input terminal of the operational amplifier OP10 in the amplifier circuit 23. The diode D5 is arranged such that the anode of the diode D5 is connected to the output terminal of the operational amplifier OP10 and the cathode of the diode D5 is connected to the non-inverting input terminal of the operational amplifier OP10 via the resistor R15.

Connecting the series-connected circuit of the diode D5 and the resistor R15 as described above forms a path for feeding back an output of the operational amplifier OP10 to the non-inverting input terminal. Thus, after the voltage V1, which is input to the non-inverting input terminal of the operational amplifier OP10, rises to the threshold voltage level, which is input to the inverting input terminal of the operational amplifier OP10, and the operational amplifier OP10 outputs the "H" level, even if the voltage V1 drops to a level less than the threshold voltage level, feeding back the "H" level output to the non-inverting input terminal causes the "H" level output to be maintained. In other words, in this case, after the "H" level is output as a trigger, the operational amplifier OP10 latches the "H" level and outputs the "H" level irrespective of the condition of the voltage V1. The delay time difference between the point in time when the operational amplifier OP10 starts outputting the "H" level and the point in time when the latch operation becomes effective can be determined by a time constant of the resistor R15.

Figure 5:
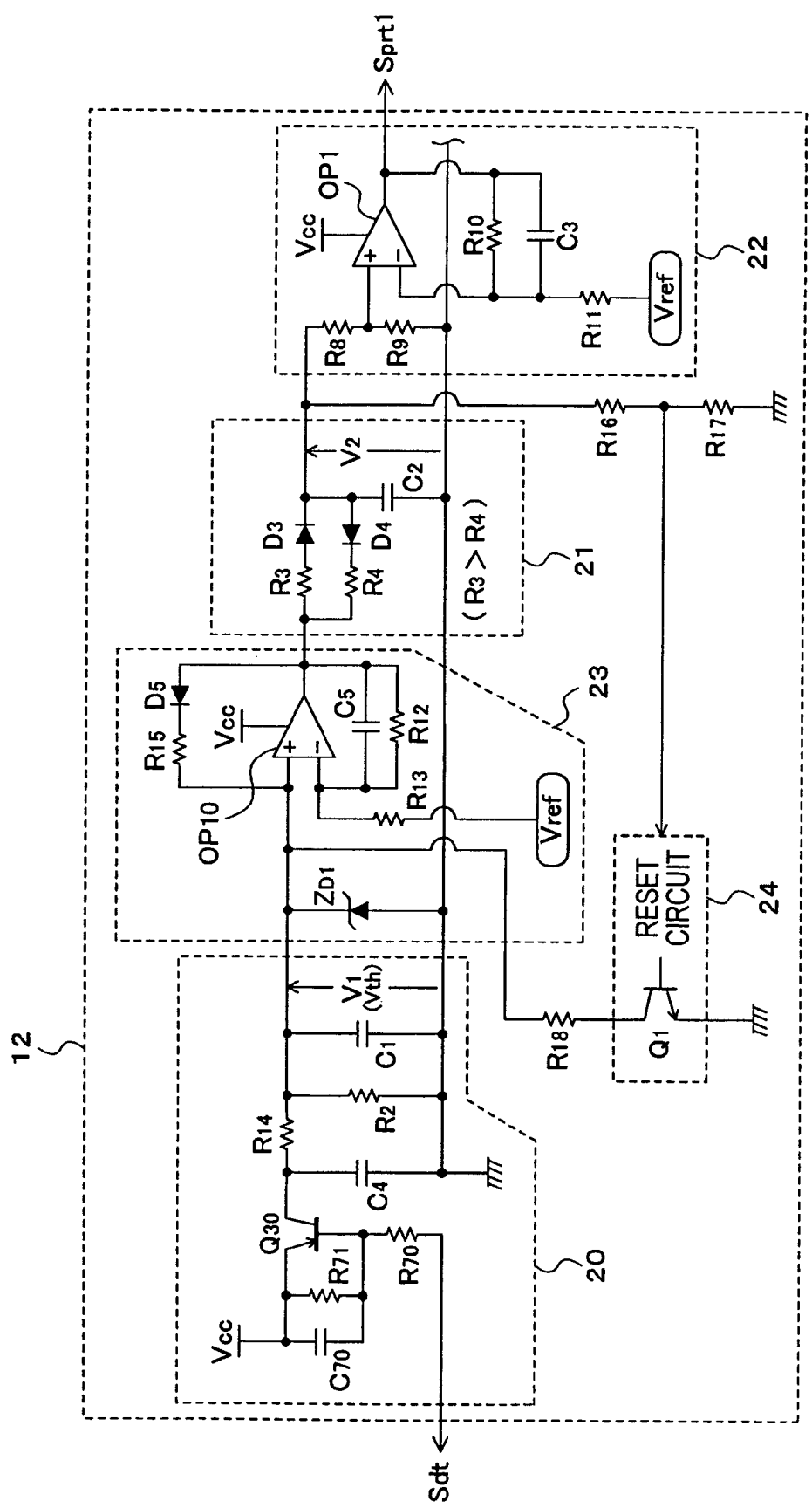
FIG. 5 is a circuit diagram showing a third example of the structure of the protection circuit provided in the power supply circuit according to the embodiment.

In addition, the protection circuit 12 shown in FIG. 5 includes a reset circuit 24 for resetting the latched output of the operational amplifier OP10.

The reset circuit 24 functions as an amplifier circuit including an NPN transistor Q1. The collector of the transistor Q1 is connected to the non-inverting input terminal of the operational amplifier OP10 via a resistor R18. The emitter of the transistor Q1 is grounded.

A voltage at a level obtained by dividing the voltage V2 across the time-constant capacitor C2 by resistors R16 and R17 is input to the reset circuit 24. When the voltage level is a predetermined value or more, the reset circuit 24 operates such that the transistor Q1 is turned on. When the transistor Q1 is turned on, the non-inverting input terminal of the operational amplifier OP10 is at a ground potential, and the operational amplifier OP10 is reset to output the "L" level. In other words, the reset circuit 24 operates to reset the operational amplifier OP10 when the voltage V2 across the time-constant capacitor C2 is the predetermined level (reset level) or more.

Figure 6:
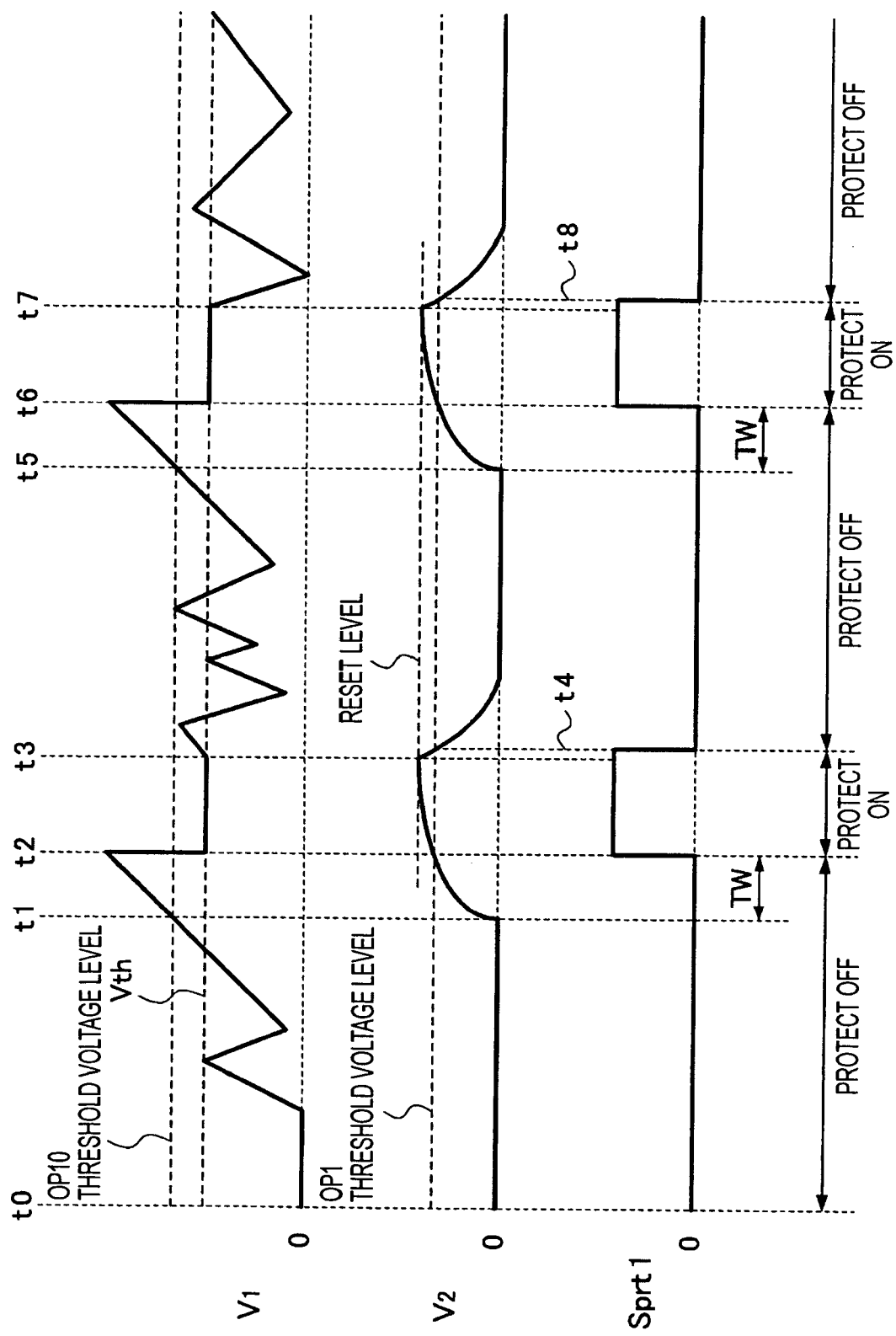
FIG. 6 is a timing chart showing an example of the operation of the protection circuit shown in FIG. 5.

FIG. 6 is a timing chart showing an example of the operation of the protection circuit 12 in the third example shown in FIG. 5.

In this case, an operation at time t1 is similar to the operation at time t1 in FIG. 4. However, as described above, since the operational amplifier OP10 in the third example latches the "H" level output, the operational amplifier OP10 starts outputting the "H" level at time t1, and maintains the "H" level until the reset operation performed by the reset circuit 24 is performed, irrespective of the level of the voltage V1 across the current-detecting capacitor C1, in other words, irrespective of a detection result by the overcurrent-detecting circuit 20.

Thus, in this case, within the standby time Tw before time t2, for example, even if the voltage V1 drops to a level less than the predetermined level when an overcurrent condition ends, charging of the time-constant capacitor C2 from time t1 is maintained, and the level of the voltage V2 increases in accordance with the time constant of the resistor R3 and the time-constant capacitor C2. At time t2, as in the case shown in FIG. 4, the voltage V2 rises to the threshold voltage level of the operational amplifier OP1. Thus, a protection signal Sprt1 is output and the protect-on state starts.

In this case, since the operational amplifier OP10 latches the "H" level and outputs the "H" level, charging of the time-constant capacitor C2 is maintained even after time t2, and the voltage V2 increases in accordance with the time constant of the resistor R3 and the time-constant capacitor C2 for charging. At time t3, that is, after the passage of a predetermined time from time t2, the voltage V2 reaches the reset level, and the reset circuit 24 operates and resets the operational amplifier OP10 to output the "L" level, as described with reference to FIG. 5. In accordance with this, discharging of the time-constant capacitor C2 starts and the voltage V2 reduces in accordance with the time constant of the resistor R4 and the time-constant capacitor C2 for discharging.

At time t4, that is, after the passage of a predetermined time from time t3, the voltage V2 drops to a level less than the threshold voltage level of the operational amplifier OP1. Thus, outputting of a protection signal Sprt1 stops, and the protect-off state starts.

In this case, at time t5, the voltage V1 across the current-detecting capacitor C1 rises to the threshold voltage level of the operational amplifier OP10, as at time t1. The operational amplifier OP10 starts outputting the "H" level at time t5, and the "H" level is latched until the reset circuit 24 performs resetting, as at time t1. Thus, irrespective of a detection result of an overcurrent condition by the overcurrent-detecting circuit 20 after time t1, the voltage V2 rises to the threshold voltage level of the operational amplifier OP1, a protection signal Sprt1 is output, and the protect-on state starts at time t6, that is, after the passage of the standby time Tw from time t5. At time t7, that is, after the passage of a predetermined time from time t6, the voltage V2 rises to the reset level, and the reset circuit 24 resets the operational amplifier OP10. Thus, discharging of the time-constant capacitor C2 starts, and the voltage V2 reduces. At time t8, that is, after the passage of a predetermined time from time t7, the voltage V2 drops to a level less than the threshold voltage level of the operational amplifier OP1, outputting of a protection signal Sprt1 stops, and the protect-off state starts.

In the operation of the protection circuit 12 shown in FIG. 3 (and FIG. 2), the duration of a protect-on state changes in accordance with a detection result of an overcurrent condition, as described with reference to FIG. 4. For example, if the overcurrent condition ends within the standby time Tw, the protect-on state does not start.

In contrast, with the structure of the protection circuit 12 shown in FIG. 5, since the operational amplifier OP10 latches an output, when the overcurrent condition is detected and charging of the time-constant capacitor C2 starts, the protect-on state (a period during which the protection signal Sprt1 is output) is generated. In addition, since charging and discharging of the time-constant capacitor C2 is performed in accordance with the predetermined time constant of the resistor R3 and the time-constant capacitor C2 for charging and in accordance with the predetermined time constant of the resistor R4 and the time-constant capacitor C2 for discharging, the same waveforms are obtained for the voltage V2 by charging and discharging operations, respectively. As a result, the duration of a protect-on state (the period during which the protection signal Sprt1 is output) having the same length is realized every time.

In other words, with the structure of the protection circuit 12 shown in FIG. 5, if the overcurrent-detecting circuit 20 detects an overcurrent condition, a protect-on state having the same period (duration) is generated every time.

In addition, the duration of a single protect-on state is equal to a predetermined duration shown by the period from time t2 to time t4 or the period from time t6 to time t8 shown in FIG. 6. For example, if the overcurrent condition is detected at time t3 (or time t7) at which the voltage reaches the reset level, in response to this, the operational amplifier OP10 keeps outputting the "H" level. Thus, after resetting at time t3 (or time t7), the voltage V2 is maintained equal to or higher than the threshold voltage level of the operational amplifier OP1. Thus, the operational amplifier OP1 keeps outputting the protection signal Sprt1. In other words, the protect-on state is maintained after time t3.

As described above, the duration during which a protection signal Sprt1 at the "H" level is output (a control time during which the amount of transmitted power is controlled) is determined by the time constant of the resistor R3 and the time-constant capacitor C2 for charging and by the time constant of the resistor R4 and the time-constant capacitor C2 for discharging in the time-constant circuit 21. In other words, changing the time constant of the time-constant circuit 21 changes the gradient of the waveform of the voltage V2 across the time-constant capacitor C2 obtained by detection of the overcurrent condition by the overcurrent-detecting circuit 20.

In addition, if the waveform of the voltage V2 is regarded as being fixed, changing the threshold voltage level of the operational amplifier OP1 changes the duration during which the protection signal Sprt1 at the "H" level is output. In this embodiment, not only the time constant of the time-constant circuit 21, but the threshold voltage level set for an operational amplifier provided in the signal output circuit 22 for outputting a protection signal Sprt is also regarded, in conceptual terms, as a time constant for setting the duration during which a protection signal Sprt at the "H" level is output (the control time during which the amount of transmitted power is controlled). This is also applicable to a case where a plurality of operational amplifiers for outputting protection signals Sprt is provided, as described below with reference to FIG. 7. The threshold voltage level can be changed in accordance with the level of the original reference voltage Vref, the resistance of a resistor between the reference voltage Vref and the inverting input terminal of the operational amplifier, or the resistances of voltage-dividing resistors connected to the non-inverting input terminal (the division ratio with respect to the voltage V2).

Figure 7:
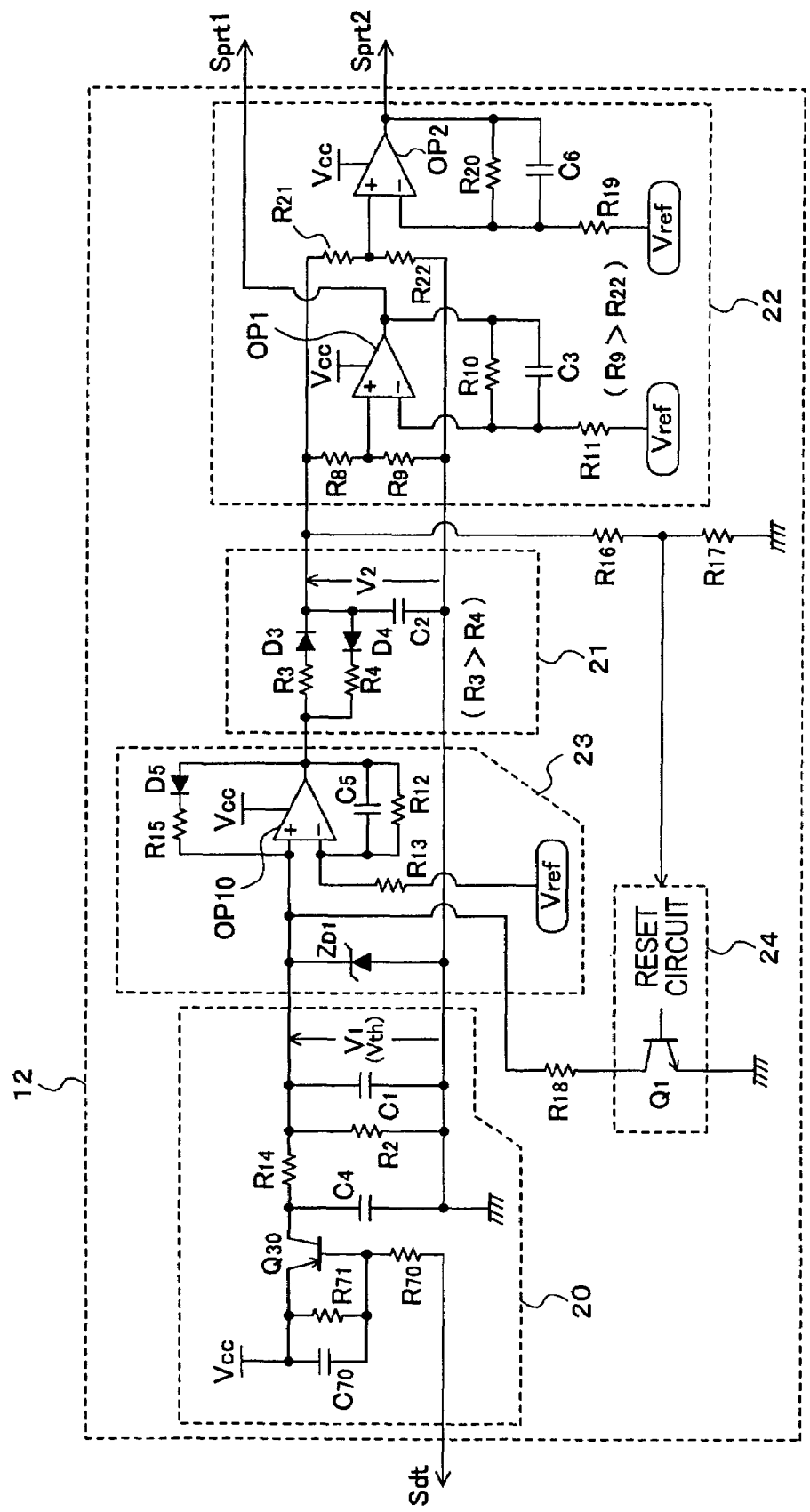
FIG. 7 is a circuit diagram showing a fourth example of the structure of the protection circuit provided in the power supply circuit according to the embodiment.

FIG. 7 shows a fourth example of the structure of the protection circuit 12. The same parts as in FIGS. 2, 3, and 5 are referred to with the same reference numerals and the descriptions of these same parts will be omitted here.

The protection circuit 12 shown in FIG. 7 further includes an amplifier circuit (comparator) including an operational amplifier OP2. The amplifier circuit including the operational amplifier OP2 is added to the signal output circuit 22 of the protection circuit 12 in the third example shown in FIG. 5.

In this case, the amplifier circuit including the operational amplifier OP2 includes resistors R19, R20, R21, and R22, and a capacitor C6 that are connected, as shown in FIG. 7, with respect to the operational amplifier OP2 and a reference voltage Vref. The connection of the resistors R19, R20, R21, and R22, and the capacitor C6 with respect to the operational amplifier OP2 and the reference voltage Vref is similar to the connection of the resistors R8, R9, R10, and R11 and the capacitor C3 with respect to the operational amplifier OP1 and the reference voltage Vref. In other words, the amplifier circuit (comparator) including the operational amplifier OP2 and the amplifier circuit (comparator) including the operational amplifier OP1 are arranged with the same circuit connection. In addition, since a series-connected circuit of the resistors R21 and the R22 is connected in parallel to the time-constant capacitor C2, the voltage V2 divided by the resistors R21 and R22 is input to the non-inverting input terminal of the operational amplifier OP2. With this structure, a protection signal Sprt1 is output in a similar manner to the cases described in the foregoing examples, and a protection signal Sprt2 is output from the operational amplifier OP2. Accordingly, in the fourth example, two protection signals are output.

However, in this case, the resistance of the resistor R9, which is a voltage-dividing resistor connected between the non-inverting input terminal of the operational amplifier OP1 and the ground, and the resistance of the resistor R22, which is a voltage-dividing resistor connected between the non-inverting input terminal of the operational amplifier OP2 and the ground, are set so as to satisfy the condition R9>R22. In other words, the voltage V2 is divided with different division ratios for the operational amplifier OP1 and the operational amplifier OP2. The voltages divided with different division ratios are input to the non-inverting input terminals of the operational amplifier OP1 and the operational amplifier OP2. This is equivalent to the threshold voltage level of the voltage V2 for the operational amplifier OP1 and the threshold voltage level of the voltage V2 for the operational amplifier OP2 being different from each other. For example, apart from the resistor R9 and the resistor R22, the level of the reference voltage Vref in the operational amplifier OP1 is equal to the level of the reference voltage Vref in the operational amplifier OP2, and the constants of the resistors R8, R10, and R11, and the capacitor C3, which are connected to the operational amplifier OP1, are equal to the constants of the resistors R19, R20, and R21, and the capacitor C6, which are connected to the operational amplifier OP2.

Figure 8:
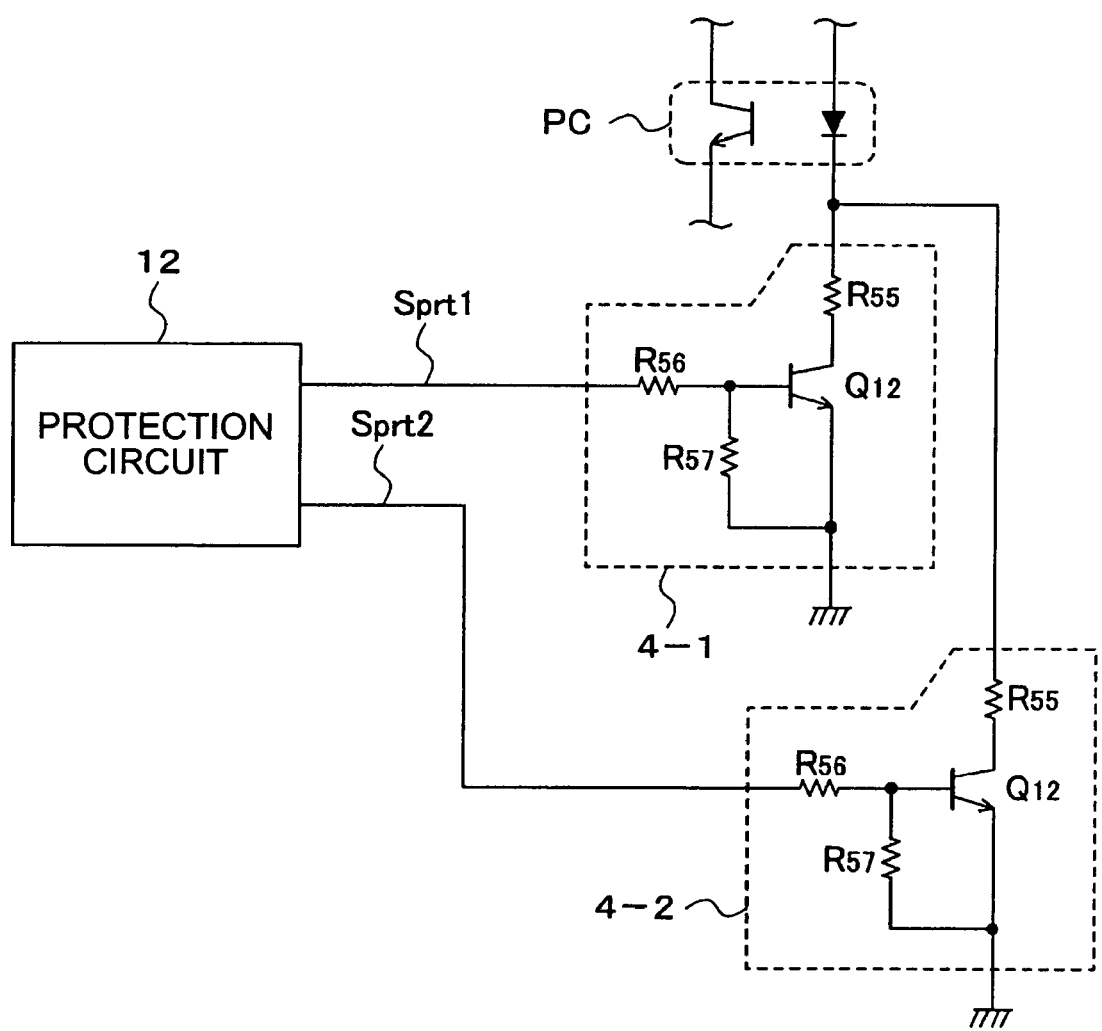
FIG. 8 is a circuit diagram showing an example of the structure of a feedback system for protection signals corresponding to the structure of the protection circuit shown in FIG. 7.
Figure 9:
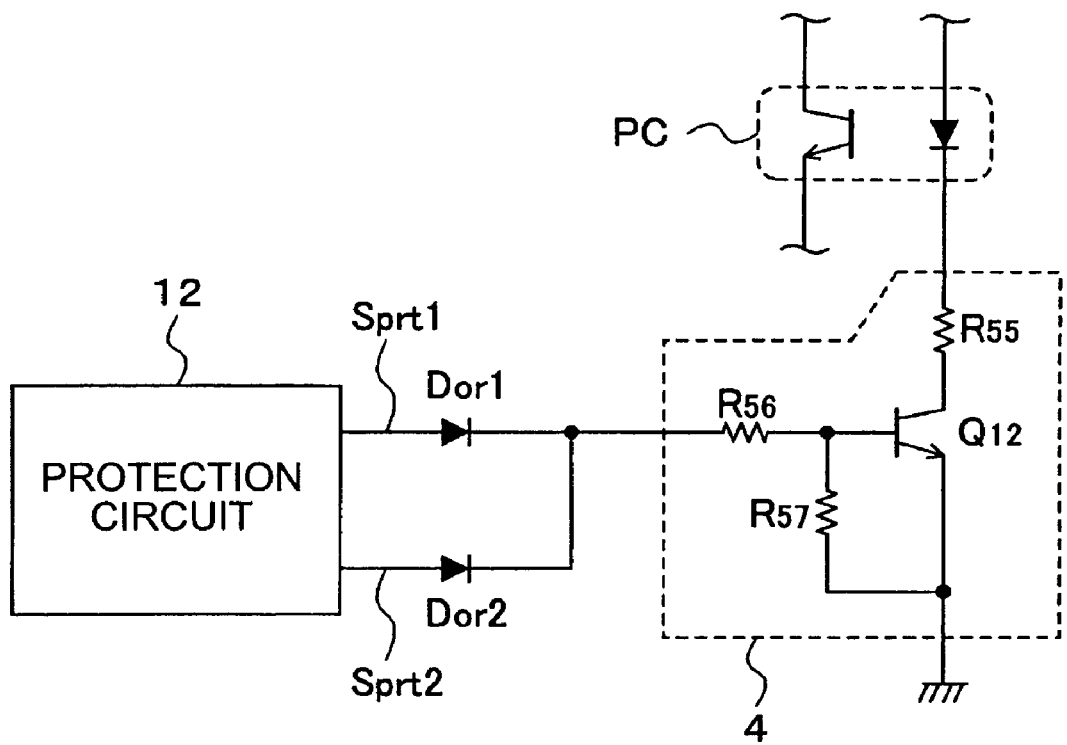
FIG. 9 is a circuit diagram showing another example of the structure of the feedback system for the protection signals corresponding to the structure of the protection circuit shown in FIG. 7.

In a case where the protection circuit 12 is capable of generating and outputting a plurality of protection signals, as described in the fourth example shown in FIG. 7, a system for feeding back the protection signals may be arranged, as shown in FIGS. 8 and 9.

Figure 14:
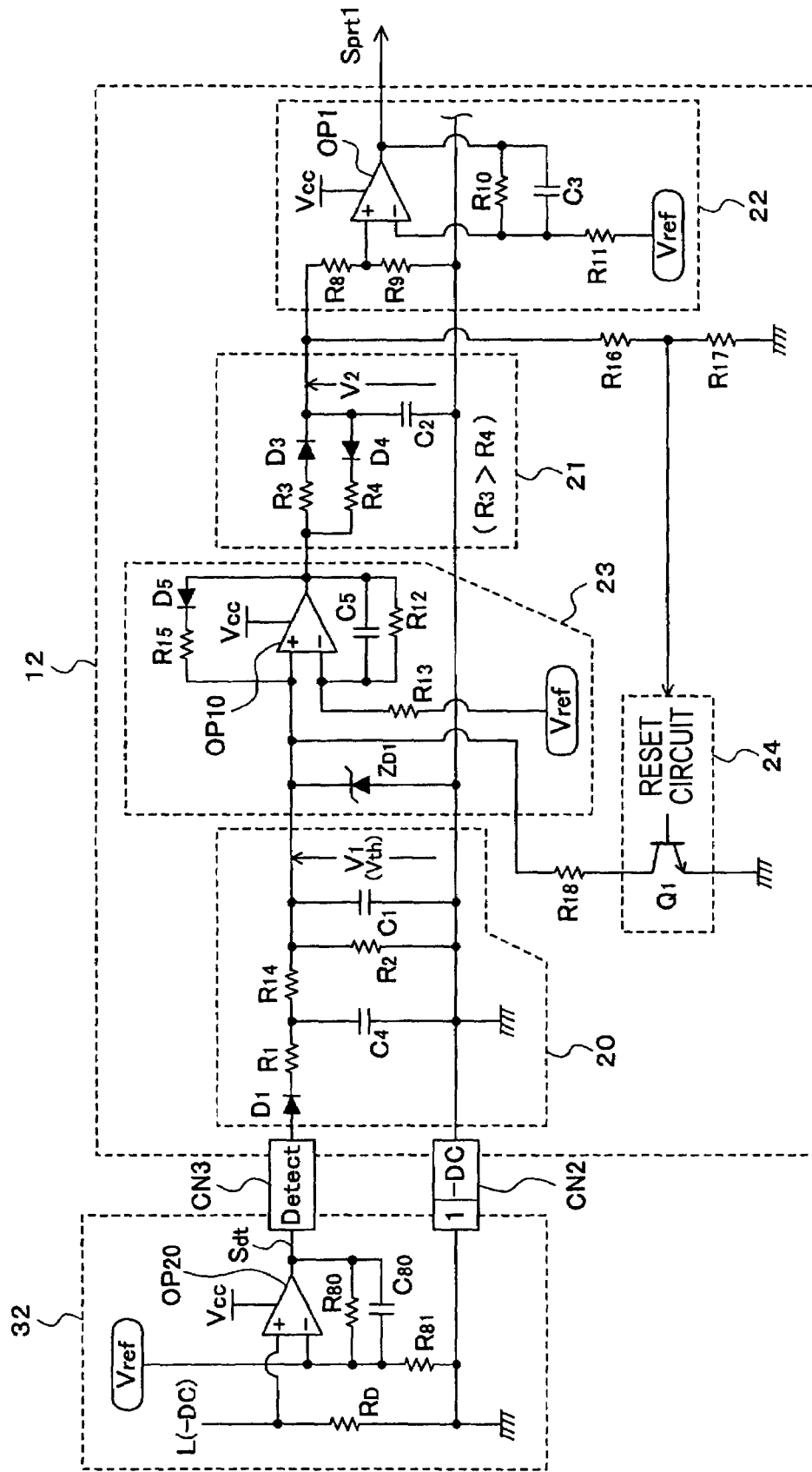
FIG. 14 is a circuit diagram showing the structure of a current-detecting circuit according to a modification of the present invention.

Referring to FIG. 8, amplifier circuits 4-1 and 4-2 are provided so as to correspond to protection signals Sprt1 and Sprt2 output from the protection circuit 12. The amplifier circuits 4-1 and 4-2 have the same structure as the amplifier circuit 14 shown in FIG. 1, and the same reference numerals as the components of the amplifier circuit 14 in FIG. 14 are used for components of the amplifier circuits 4-1 and 4-2.

The collectors of the transistors Q12 in the amplifier circuits 4-1 and 4-2 are connected to the cathode of the photodiode of the photocoupler PC via the resistors R55.

Alternatively, as shown in FIG. 9, diodes Dor1 and Dor2 are connected to signal lines for the protection signals Sprt1 and Sprt2, and the cathodes of the diodes Dor1 and Dor2 are input to an amplifier circuit 4.

With the structure shown in FIG. 8 or 9, a signal component of each of the protection signals Sprt1 and Sprt2 can be input to the feedback input terminal FB_IN of the switching drive circuit 11 via the photocoupler PC. In addition, with the connection described above, when the protection signals Sprt1 and Sprt2 at the "H" level are output at the same time, a signal obtained by combining the protection signals Sprt1 and Sprt2 is input to the feedback input terminal FB_IN.

Figure 10:
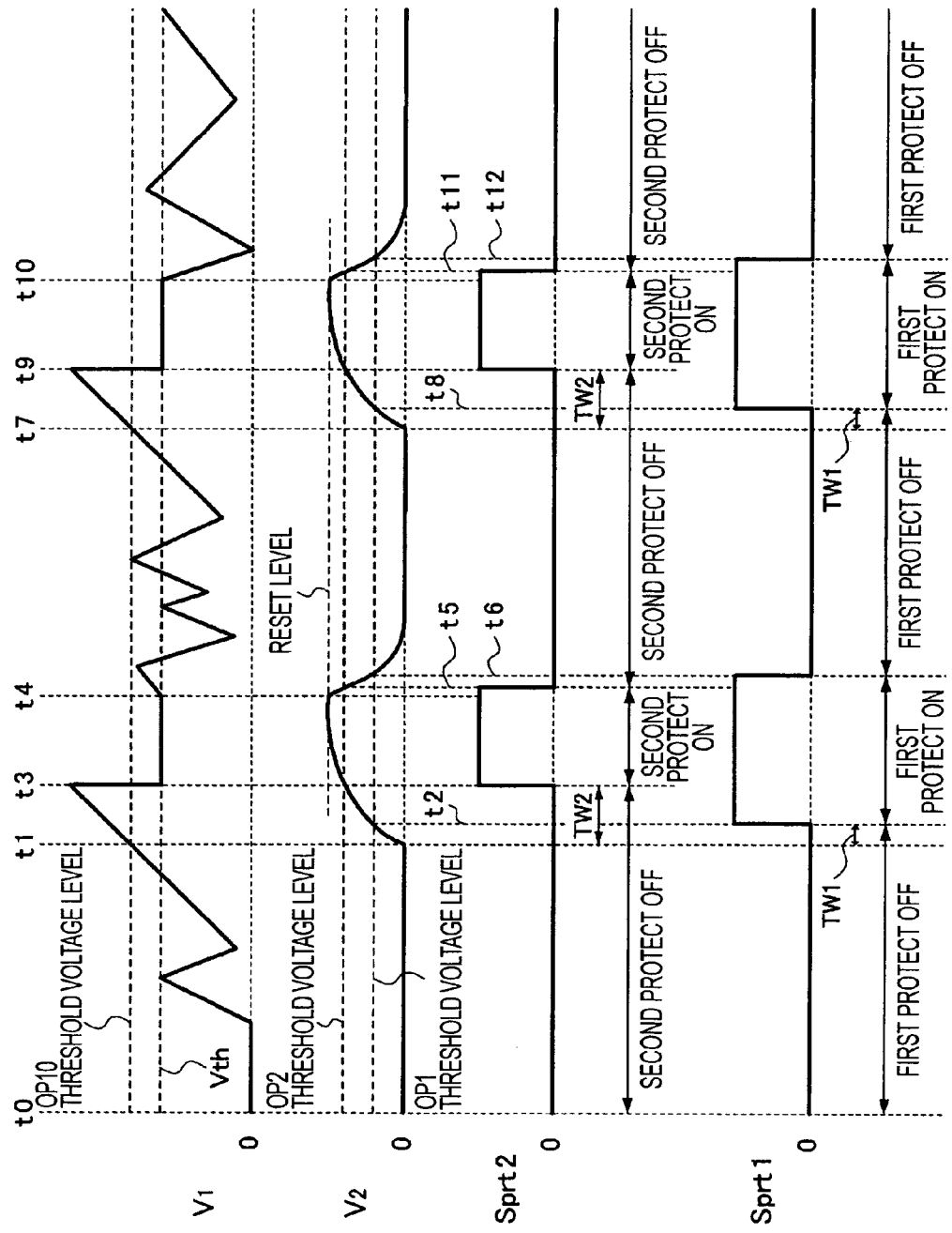
FIG. 10 is a timing chart showing an example of the operation of the protection circuit shown in FIG. 7.

FIG. 10 is a timing chart showing an example of the operation of the protection circuit 12 in the fourth example shown in FIG. 7.

The operational amplifiers OP1 and OP2 in the protection circuit 12 shown in FIG. 7 output protection signals Sprt1 and Sprt2, respectively, in an operation similar to the operation of the operational amplifier OP1 in the third example shown in FIG. 6. The operational amplifier OP10 shown in FIG. 7 feeds back an output from the operational amplifier OP10 to its non-inverting input terminal. In addition, since the reset circuit 24 is provided in the protection circuit 12 shown in FIG. 7, every time the overcurrent-detecting circuit 20 detects an overcurrent condition, the protection signals Sprt1 and Sprt2 are output for the same period (duration).

However, as described with reference to FIG. 7, different threshold voltage levels of the voltage V2 are set for the operational amplifier OP1 and the operational amplifier OP2. In this case, the resistors R9 and R22 are set so as to satisfy the condition R9>R22. Thus, as shown by the voltage V2 in FIG. 10, in accordance with the relationship that the threshold voltage level of the operational amplifier OP1 is lower than the threshold voltage level of the operational amplifier OP2, predetermined levels are set in accordance with the resistances of the resistors R9 and R22.

Thus, the operational amplifier OP1 outputs the protection signal Sprt1 at the "H" level during a period from time t2 to time t6 (or a period from time t8 to time t12) based on time t1 (or time t7) at which an overcurrent condition is detected. Here, a period during which the protection signal Sprt1 at the "H" level is output is referred to as a first protect-on state, and a period during which the protection signal Sprt1 at the "L" level is output is referred to as a first protect-off state.

The operational amplifier OP2 outputs the protection signal Sprt2 at the "H" level during a period from time t3 to time t5 (or a period from time t9 to time t11) based on time t1 (or time t7) at which the overcurrent condition is detected. Here, a period during which the protection signal Sprt2 at the "H" level is output is referred to as a second protection state, and a period during which the protection signal Sprt2 at the "L" level is output is referred to as a second protect-off state.

In other words, since the threshold voltage level of the voltage V2 for the operational amplifier OP1 differs from the threshold voltage level of the voltage V2 for the operational amplifier OP2, the duration during which the protection signal Sprt1 at the "H" level is output (the duration of the first protect-on state) includes the duration during which the protection signal Sprt2 at the "H" level is output (the duration of the second protect-on state), and the duration of the first protect-on state is longer than the duration of the second protect-on state.

Accordingly, when two-stage protect-on periods are provided, the power of the power-supply circuit section 1 is controlled as described below. In the descriptions below, the protection signals Sprt1 and Sprt2 are fed back with the structure shown in FIG. 8 or FIG. 9.

In this case, for example, the overcurrent-detecting circuit 20 detects an overcurrent condition at time t1, and after the passage of the standby time Tw1, which corresponds to a period from time t1 to time t2, the protection signal Sprt1 at the "H" level is output. Even after the passage of the standby time Tw1, the protection signal Sprt2 is maintained at the "L" level. Thus, from time t2, in accordance with only the level of a signal component of the protection signal Sprt1, the switching drive circuit 11 changes the switching frequency, and the amount of power transmitted to the secondary side (load side), in other words, the amount of power output from the power-supply circuit section 1 to the load (the power amplifier circuits 31 in the power amplifier system section 2) is reduced.

At time T3, that is, after the passage of a standby time Tw2, which is longer than the standby time Tw1, from the time t1 at which the overcurrent-detecting circuit 20 detects the overcurrent condition, the protection signal Sprt2 at the "H" level is output. The protection signal Sprt1 is maintained at the "H" level even after the standby time Tw2 passes. Thus, from time t3, a signal obtained by combining signal components of the protection signals Sprt1 and Sprt2 is fed back. In other words, the level of the feedback signal input to the feedback input terminal FB_IN of the switching drive circuit 11 increases. In accordance with this, the amount of change in the switching frequency controlled by the switching drive circuit 11 increases, and the amount of power transmitted to the load is thus further reduced.

Then, at time t5, outputting of a protection signal Sprt2 at the "H" level stops. In contrast, the protection signal Sprt1 is maintained at the "H" level until time t6. Thus, during a period from time t5 to time t6, as in the period from time t2 to time t3, the amount of output power is reduced in accordance with only the signal component of the protection signal Sprt1. Then, at time t6, outputting of a protection signal Sprt1 stops.

In other words, the overcurrent condition is detected at time t1. During a period between time t2, that is, after the passage of the standby time Tw1, and time t3, that is, after the passage of the standby time Tw2 from time t1, the first protect-on state and the second protect-off state are set. During this period, the amount of output power is reduced based on the amount of reduction in accordance with only the signal level component of the protection signal Sprt1. This is a first-stage protection operation.

During a period from time t3 to time t5, the first protect-on state and the second protect-on state are set. During this period, the amount of output power is reduced based on the amount of reduction in accordance with the signal level obtained by combining the protection signals Sprt1 and Sprt2. The amount of reduction in this period is larger than the amount of reduction by the first-stage protection operation. In other words, the amount of output power is further reduced. This is a second-stage protection operation. During a period from time t5 to time t6, the first protect-on state and the second protect-off state are set. Thus, the first-stage protection operation is performed again. Then, from time t6, the first protect-off state and the second protect-off state are set. In other words, the protection operation is not performed.

During a period from time t7 to time t12, the same operation as in the period from time t1 to time t6 is performed.

As described above, the protection circuit 12 in the fourth example shown in FIG. 7 operates such that a two-stage operation to restrict the amount of output power (that is, a protection operation) is performed using a power supply (output) with a predetermined amount of reduction as a first stage and using a power supply (output) with a predetermined amount of reduction as a second stage, the amount of reduction in the second stage being larger than the amount of reduction in the first stage. By performing such a protection operation in a staged manner, for example, a protection operation is capable of accurately reacting to a state in which a peak load current is output continuously. In addition, by gradually reinforcing the protection operation as necessary, further security can be ensured.

Figure 11:
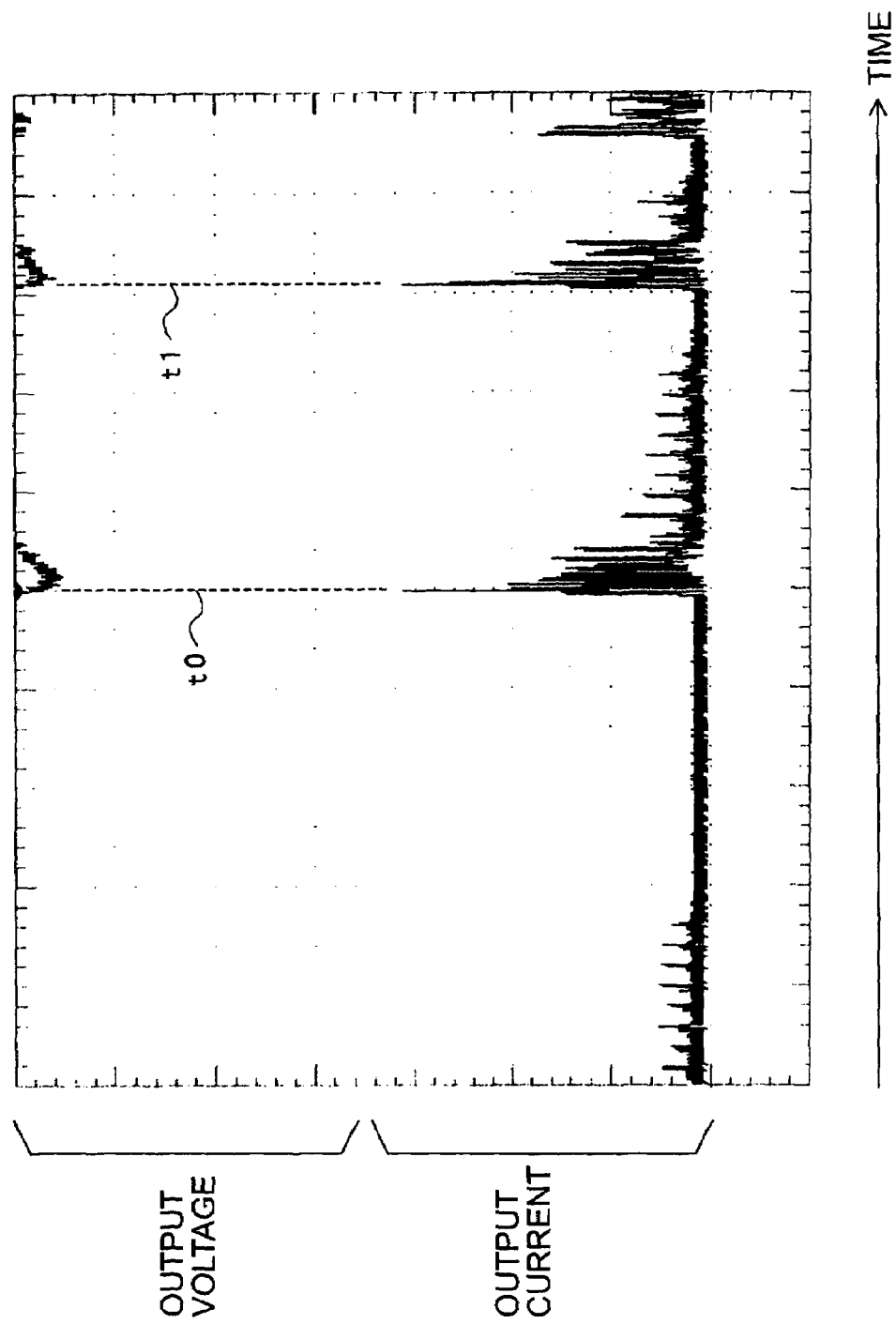
FIG. 11 shows an experimental result of the protection operation of the power amplifier apparatus according to the embodiment.
Figure 12:
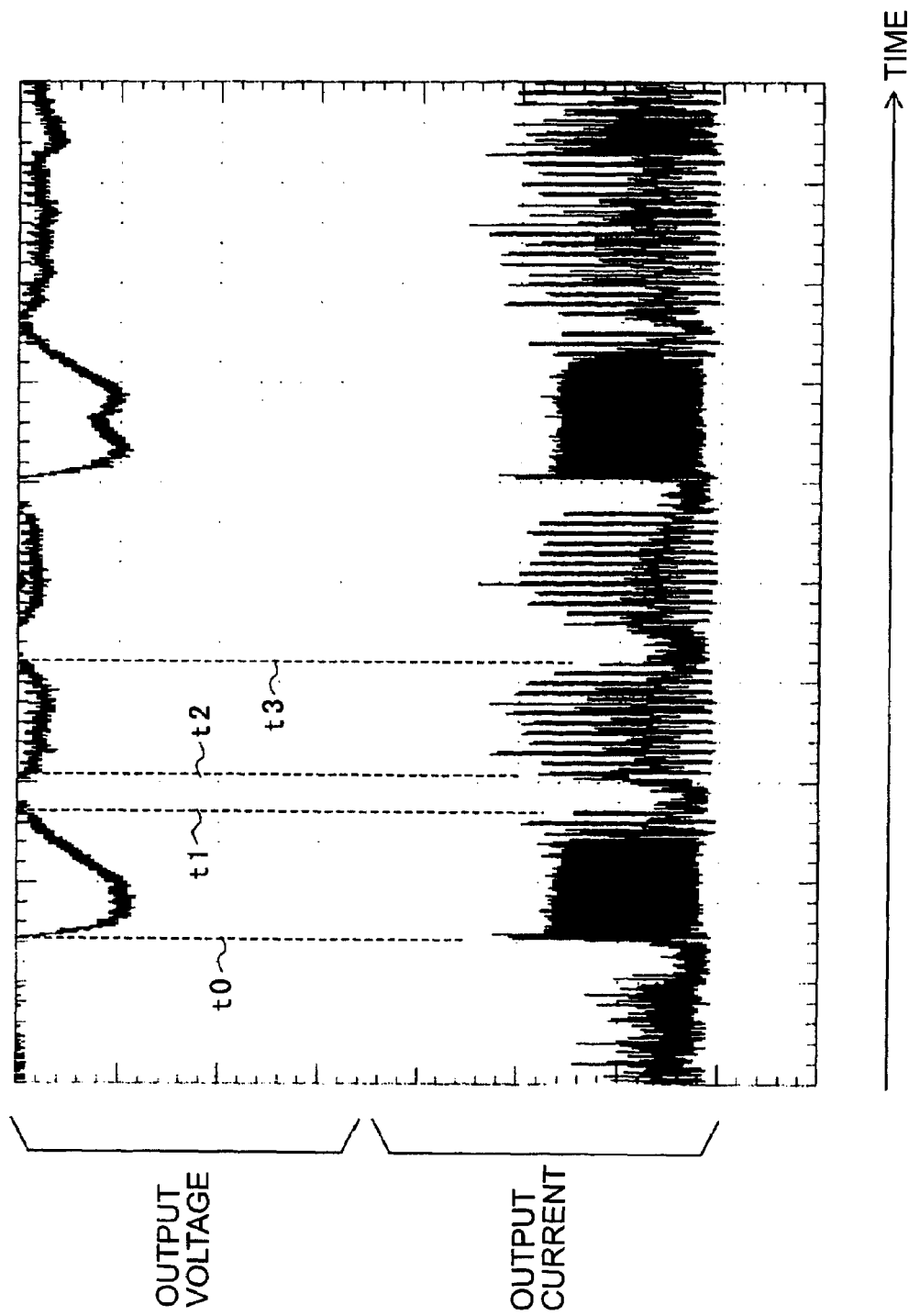
FIG. 12 shows another experimental result of the protection operation of the power amplifier apparatus according to the embodiment.
Figure 13:
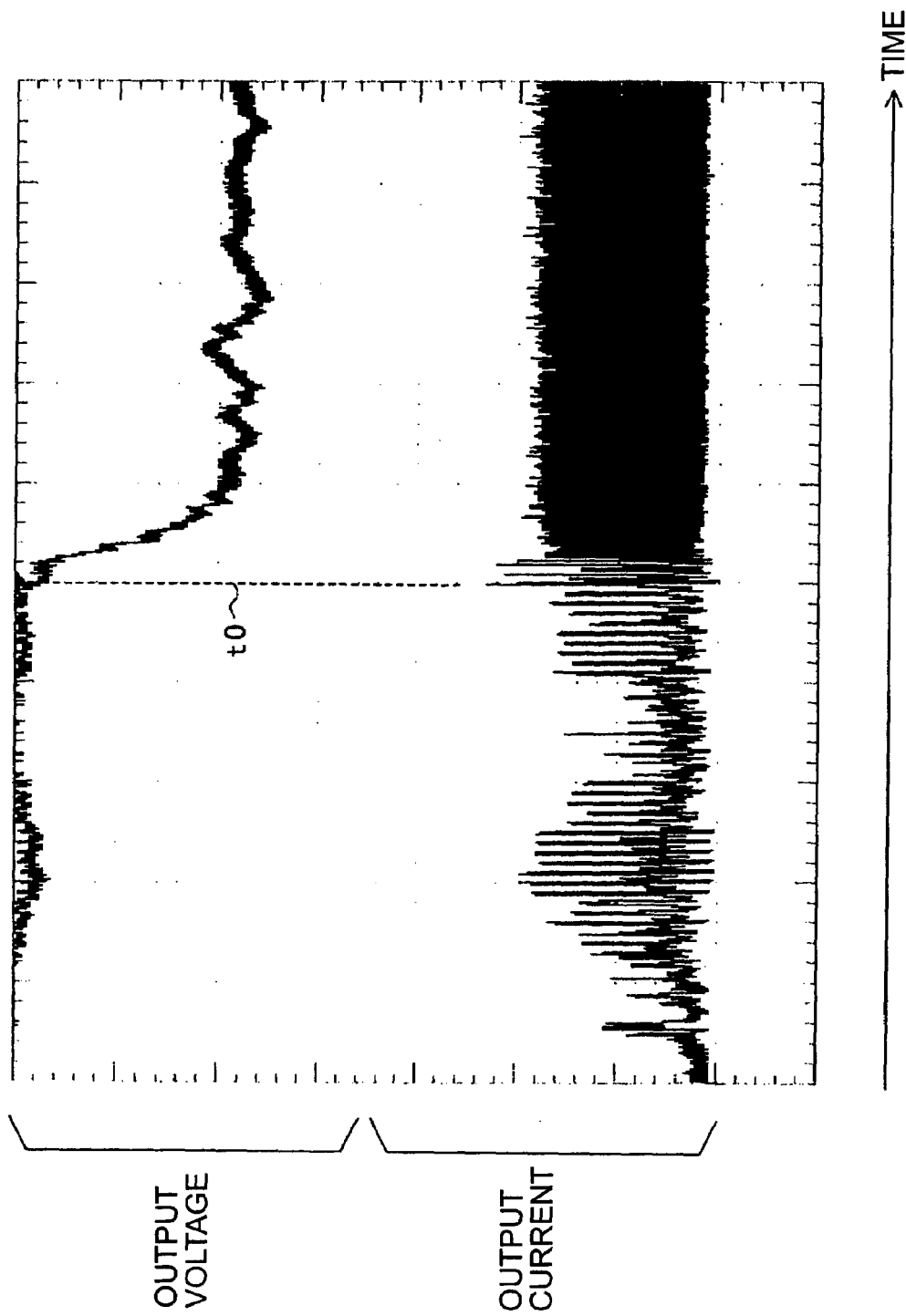
FIG. 13 shows another experimental result of the protection operation of the power amplifier apparatus according to the embodiment.

FIGS. 11 to 13 show experimental results of the protection operation performed by the protection circuit 12 in this embodiment. The experimental results shown in FIGS. 11 to 13 have a common tendency among the first to fourth examples of the structure of the protection circuit 12. In FIGS. 11 to 13, for example, the level of the secondary DC output voltage Eo of the power-supply circuit section 1 and the level of a secondary output current (load current) supplied to a load for the secondary DC output voltage Eo are shown in association with the lapse of time. Since a power amplifier functions as a load in this case, the level of the load current corresponds to the level of a current flowing toward the power amplifier in accordance with driving of a speaker. The level of the load current also corresponds to the sound volume output from the speaker.

FIG. 11 shows a case where the protection circuit 12 hardly performs a protection operation.

In the case shown in FIG. 11, for example, as shown at time t0 or time t1, a secondary output current exhibits a level close to the peak level for a very short time at predetermined time intervals. This state corresponds to a state in which a single-shot sound with a high volume, such as a drum sound, is output from the speaker at predetermined time intervals.

As described above, the protection circuit 12 does not start the protection operation until a standby time Tw corresponding to a time constant set by the time-constant circuit 21 passes from a point in time when the overcurrent-detecting circuit 20 detects an overcurrent condition.

Thus, even if a secondary output current reaches a level close to the peak level, when the current exhibits the level close to the peak level for only a short time and the secondary output current returns to a level below the peak level within the standby time Tw, as shown in FIG. 11, the protection operation is not performed for this current level. In other words, the power-supply circuit section 1 does not restrict the amount of power supplied to a power amplifier functioning as a load, and supplies to the power amplifier the power corresponding to the level close to the peak level of the secondary output current at this time. Thus, the power amplifier outputs sound from a speaker with a sound volume corresponding to the level close to the peak level of the secondary output current.

As described above, according to this embodiment, for example, even if sound with a volume that corresponds to substantially the maximum load is output from a speaker, when the sound is output for a short time, the sound volume is not restricted and powerful sound can be achieved without reducing a sense of sufficient loudness. For example, if such loud sound for a short time, which is typified by a drum sound, is output without restricting the volume level, it is obvious that the sense of sufficient loudness can be achieved as a general audio impression. Since substantially the maximum load (a level close to the peak load current) is used for only a short time within the standby time Tw, such substantially maximum load does not destroy the power amplifier circuit, the speaker, components in the power-supply circuit section, and the like. In addition, the duration of the standby time Tw, that is, the time constant of the resistor R3 and the time-constant capacitor C2 for a charging path in the time-constant circuit 21, is set by taking into consideration not only that a single loud sound is not reduced but also that the circuit components are prevented from being destroyed.

FIG. 12 shows a case where a secondary output current exhibits a level close to the peak level at shorter time intervals and the level close to the peak level is generated more continuously compared with the case described with reference to FIG. 11.

For example, during a period from time t0 to time t1 in FIG. 12, the secondary output current exhibits the level close to the peak level continuously at very short time intervals. The secondary DC output voltage level reduces by a relatively large amount in accordance with the secondary output current, as shown in FIG. 12. In other words, the protect-on state is set during the period from time t0 to time t1, and the amount of output power is restricted in this state.

During a period from time t2 to time t3, the secondary output current also exhibits a level close to the peak level continuously. However, during the period from time t2 to time t3, the secondary output current exhibits the level close to the peak level at longer time intervals and the peak occurrence density is thus lower compared with the period from time t0 to time t1. In this state, since the delay time until the protect-on state corresponding to the standby time Tw determined by the time constant of the time-constant circuit 21 and the time for releasing the protect-on state operate effectively, the amount of reduction of power supply is reduced. In other words, the amount of reduction in the secondary output voltage level during this period is not as large as the period from time t0 to t1.

In other words, in this embodiment, when a secondary output current exhibits a level close to the peak level continuously at very short time intervals and the peak level of the load current continues for a relatively long time, as shown by the period from time t0 to time t1, the protection circuit 12 performs protection with strong power restriction. In contrast, when a secondary output current periodically exhibits a level close to the peak level and the peak occurrence density per unit time is relatively low, as shown by the period from time t2 to time t3, the protection circuit 12 performs protection with weak power restriction, and the sense of sufficient loudness is not reduced.

FIG. 13 shows a case where a secondary output current continuously exhibits the peak level for a long time.

Referring to FIG. 13, slightly after time t0, the secondary output current continuously exhibits the peak level at very short time intervals. In response to this, the level of a secondary output voltage reduces from slightly after time t0, and the reduced state is maintained. In other words, since the secondary output current continuously exhibits the peak level, an operation to restrict power (protection operation) is performed continuously, so that the circuit can be protected.

As described above, in this embodiment, if an overcurrent condition occurs temporarily or if the overcurrent condition occurs periodically at relatively longer time intervals, the protection circuit 12 performs a protection operation without restricting the amount of output power or with weak power restriction. Thus, when a power amplifier is connected as a load, loud sound is not restricted for an instantaneous overcurrent condition or an overcurrent condition for only a short time, and sound reproduction with a sense of sufficient loudness can be achieved.

If the overcurrent condition continues, the protection operation is performed effectively. Thus, the power supply circuit and the load (power amplifier) circuit can be prevented from being destroyed.

In this embodiment, since the power-supply circuit section 1 controls power in accordance with an overcurrent condition, the following advantages can be achieved.

For example, in order to handle a loud sound output without reducing the sense of sufficient loudness, a procedure can be considered in which a power-supply circuit section is designed such that prevention of destruction of the circuit is ensured even when the maximum load power (a load current at the peak level) continues. In this case, however, the cost increases. In addition, the size of a mounting board of the power-supply circuit section increases, and the weight of the power-supply circuit section thus increases. In particular, in a case where a digital amplifier (a class D amplifier) is adopted as a power amplifier in the subsequent stage, since the digital amplifier is used in order mainly to reduce the size and weight, this procedure is disadvantageous.

In contrast, in this embodiment, since only temporary peak power is to be coped with, components having a withstand voltage and a withstand current that are equivalent to known components can be used in the power-supply circuit section. Thus, an increase in the size, weight, and cost of the circuit board can be prevented. The protection circuit 12 in this embodiment includes general components, as shown in FIG. 2, 3, 5, or 7. Thus, compared with a case where the power-supply circuit section is designed to handle continuous peak load power, the increase in the size and cost of the circuit section can be reduced.

In this embodiment, in general, the power amplifier system section 2, which functions as a load of the power-supply circuit section 1, independently has a function to protect an overcurrent condition for the power amplifier system section 2 itself. In general, this protection function operates such that a microcomputer provided in the power amplifier system section 2 stops an amplification operation of a power amplifier circuit in response to detection of the overcurrent condition. Incidentally, in a case where a plurality of power amplifier circuits 31 is provided so as to correspond to a multichannel configuration, as in the power amplifier system section 2 in this embodiment, all the power amplifier circuits 31 stop the amplification operation in response to detection of the overcurrent condition. In other words, the power amplifier system section 2 does not operate.

For example, when a power-supply circuit section that is designated to handle continuous peak load power is used as a power supply for a power amplifier system section having such a protection function, in a state where a peak-level load current continues, the protection function of the power amplifier system section operates. Thus, sound output from a speaker stops.

In contrast, in this embodiment, since the power-supply circuit section 1 performs power control, so long as the protection circuit 12 performs the protection operation, normally, the protection function of the power amplifier system section 2 does not operate. In other words, the operation of the power amplifier system section 2 is not stopped by the protection function of the power amplifier system section 2, and a sense of sufficient loudness is achieved.

For example, during a standby time Tw, the protection circuit 12 in this embodiment does not perform protection, and a load current close to the peak level flows. However, as described above, since a microcomputer causes the protection function of the power amplifier system section 2 to operate, due to the processing capacity and the usage of the microcomputer, the time from detection of an overcurrent condition to the start of the protection operation is longer than the standby time Tw. Thus, when the load current close to the peak level flows during the standby time Tw, the protection function of the power amplifier system section 2 dose not operate.

In addition, as a multichannel audio system, sound reproduction with a smaller number of audio channels can be performed as long as the number of audio channels is within a range of the maximum possible number of audio channels. More specifically, for example, when the maximum possible number of audio channels corresponds to 5.1-channel surround sound and when the audio source is L and R stereo, such as compact discs (CDs), sound reproduction with L and R stereo using two channels, such as front left (FL) and front right (FR), can be performed.

This means that, in the multichannel-compatible power amplifier system section 2, shown in FIG. 1, the power amplifier circuits 31 of all power amplifier units from the first power amplifier unit 2a-1 to the n-th power amplifier unit 2a-n do not need to perform the amplification operation. Also, some power amplifier circuits 31 may not perform the amplification operation, depending on the audio source.

In this embodiment, the maximum output capacity of the power-supply circuit section 1 is determined by taking into consideration the conditions, such as the total load power and the like, when the power amplifier circuits 31 of all power amplifier units from the first power amplifier unit 2a-1 to the n-th power amplifier unit 2a-n provided in the power amplifier system section 2 perform the amplification. Thus, when the number of power amplifier circuits 31 used is smaller than the maximum possible number, from the point of view of the power-supply circuit section 1, the amount of power supplied from the power-supply circuit section 1 does not reach the maximum output capacity.

In known systems, in a case where the number of power amplifier circuits that perform an amplification operation is smaller than the maximum possible number, if the volume of sound to be output from the speakers increases, the load power (load currents) of the power amplifier circuits that perform the amplification operation increases in accordance with the increase in the sound volume.

In this case, for example, even if the power amplifier circuits enter a state in which substantially the maximum load power is used and in which load currents should not be further increased in view of protection of the circuits, the power-supply circuit section does not reach the maximum power supply. Thus, if the volume of sound to be output from the speakers is further increased, the power-supply circuit section increases the amount of power supplied. As a result, for example, the protection function of the power amplifier system section operates by processing of the microcomputer, and the amplification operation of the power amplifier circuits stops. Thus, for example, users feel that a protection operation on loud sound is more likely to be performed (sound output is more likely to stop) as the number of audio channels used for sound reproduction is reduced. Therefore, the reliability of the apparatus is reduced.

In contrast, in this embodiment, power control by the power-supply circuit section 1 is based on the load power (the level of load current) of the plurality of power amplifier circuits 31 provided in the power amplifier system section 2 so as to correspond to a multichannel configuration.

Thus, even if the amount of power supplied does not reach the maximum output capacity of the power-supply circuit section 1, when the power amplifier circuits 31 that perform an amplification operation are in an overcurrent (overload) condition, the protection circuit 12 of the power-supply circuit section 1 controls the amount of output power. Thus, the protection function of the power amplifier system section 2 does not operate by processing of the microcomputer.

Thus, in this embodiment, the tendency for the protection operation on loud sound to be more likely to be performed (sound output to be more likely to stop) as the number of audio channels used for sound reproduction reduces is overcome. Thus, the reliability of the apparatus increases. In addition, as described above, since power control does not react to an instantaneous or temporary overload condition, the sense of sufficient loudness is not reduced.

In this embodiment, for example, as described above, even in a reproduction mode in which a reduced number of audio channels is used for sound reproduction, the amount of output power to the power amplifier circuits 31 is properly controlled. This is because the control system is arranged such that a detection result of load currents of the power amplifier circuits 31 is fed back to the power-supply circuit section 1, which supplies power.

Thus, the power-supply circuit section 1 controls the amount of output power in accordance with the load condition of the power amplifier circuits 31, in other words, the power-supply circuit section 1 and the power amplifier circuits 31 operate in association with each other. As a result, the inconvenience that occurs in a known structure of the power-supply circuit section and power amplifier circuits each having an independent overcurrent protection function can be avoided. In addition, high reliability and high performance can be performed by such an overcurrent protection operation.

Modifications of the present invention will be described with reference to FIGS. 14 and 15.

FIG. 14 shows a modification in which the current-detecting circuit 32 is provided in each of the power amplifier units 2a in the power amplifier system section 2. In FIG. 14, the internal structure of the current-detecting circuit 32 and the protection circuit 12 of the power-supply circuit section 1 is shown. The protection circuit 12 shown in FIG. 14 has a structure based on the structure shown in FIG. 5.

Although only one current-detecting circuit 32 is shown in FIG. 14, the current-detecting circuit 32 is provided in each of the first power amplifier unit 2a-1 to the n-th power amplifier unit 2a-n. All the current-detecting circuits 32 are connected in parallel to the common protection circuit 12 in the connection manner shown in FIG. 14.

In FIG. 14, the same parts as in FIG. 5 are referred to with the same reference numerals and the descriptions of these same parts will be omitted here.

In the current-detecting circuit 32 shown in FIG. 14, a current-detecting resistor RD is provided in a negative power-supply input line L(–DC) such that one end is connected to the ground. A non-inverting input terminal of an operational amplifier OP20 is connected to the ground via the current-detecting resistor RD.

An inverting input terminal of the operational amplifier OP20 is connected to a line of a reference voltage Vref. A resistor R81 is provided between the ground and the connection point of the reference voltage Vref and the inverting input terminal of the operational amplifier OP20.

In addition, a feedback resistor R80 is connected between the output terminal and the inverting input terminal of the operational amplifier OP20. A capacitor C80 is connected in parallel to the feedback resistor R80.

The output terminal of the operational amplifier OP20 outputs a component of the current-detecting signal Sdt to the overcurrent-detecting circuit 20 of the protection circuit 12 via the detection signal connector CN3. The overcurrent-detecting circuit 20 includes a series-connected circuit of the diode D1 and the resistor R1, instead of the amplifier circuit including the transistor Q30, the resistors R70 and R71, and the capacitor C70. The output of the operational amplifier OP20 via the detection signal connector CN3 is applied to the connection point of the capacitor C4 and the resistor R14 via the diode D1 (from the anode to the cathode) and the resistor R1. The other components of the protection circuit 12 are arranged as in FIG. 5.

The current-detecting circuit 32 arranged as described above operates as a comparator in which the operational amplifier OP20 selectively outputs the "H" level and the "L" level in accordance with the level of the voltage across the current-detecting resistor RD.

In other words, the reference voltage Vref and a predetermined threshold voltage level set in accordance with the resistance of the resistor R81 are input to the inverting input terminal of the operational amplifier OP20, and the voltage across the current-detecting resistor RD is input to the non-inverting input terminal of the operational amplifier OP20. The voltage across the current-detecting resistor RD is based on the level of a current (load current) flowing in the negative power-supply input line L(–DC).

For example, when the load state of the power amplifier circuit 31 of the power amplifier unit 2a including the current-detecting circuit 32 does not reach an overload condition, the level of a current flowing in the negative power-supply input line L(–DC) is lower than the level corresponding to an overcurrent condition. Thus, the voltage across the current-detecting resistor RD is regarded as being at a level less than the threshold voltage level. In this case, the operational amplifier OP20 outputs the "L" level.

In contrast, when the power amplifier circuit 31 of the power amplifier unit 2a including the current-detecting circuit 32 enters an overload condition, a current flowing in the negative power-supply input line L(–DC) is at a level corresponding to an overcurrent condition. Thus, the voltage across the current-detecting resistor RD rises to the threshold voltage level. Thus, the operational amplifier OP20 outputs the "H" level.

As described above, in accordance with a load condition of the corresponding power amplifier circuit 31, each of the current-detecting circuits 32 selectively outputs the "H" level and the "L" level in accordance with a component of a current-detecting signal Sdt.

In practice, the protection circuit 12 outputs a protection signal Sprt1 by the operation described with reference to FIGS. 5 and 6 in accordance with the current-detecting signal Sdt obtained by combining outputs of the current-detecting circuits 32. In other words, with the structure shown in FIG.

14, the amount of power output from the power-supply circuit section 1 to the power amplifier system section 2 is properly controlled in accordance with the current-detecting signal Sdt.

Figure 15:
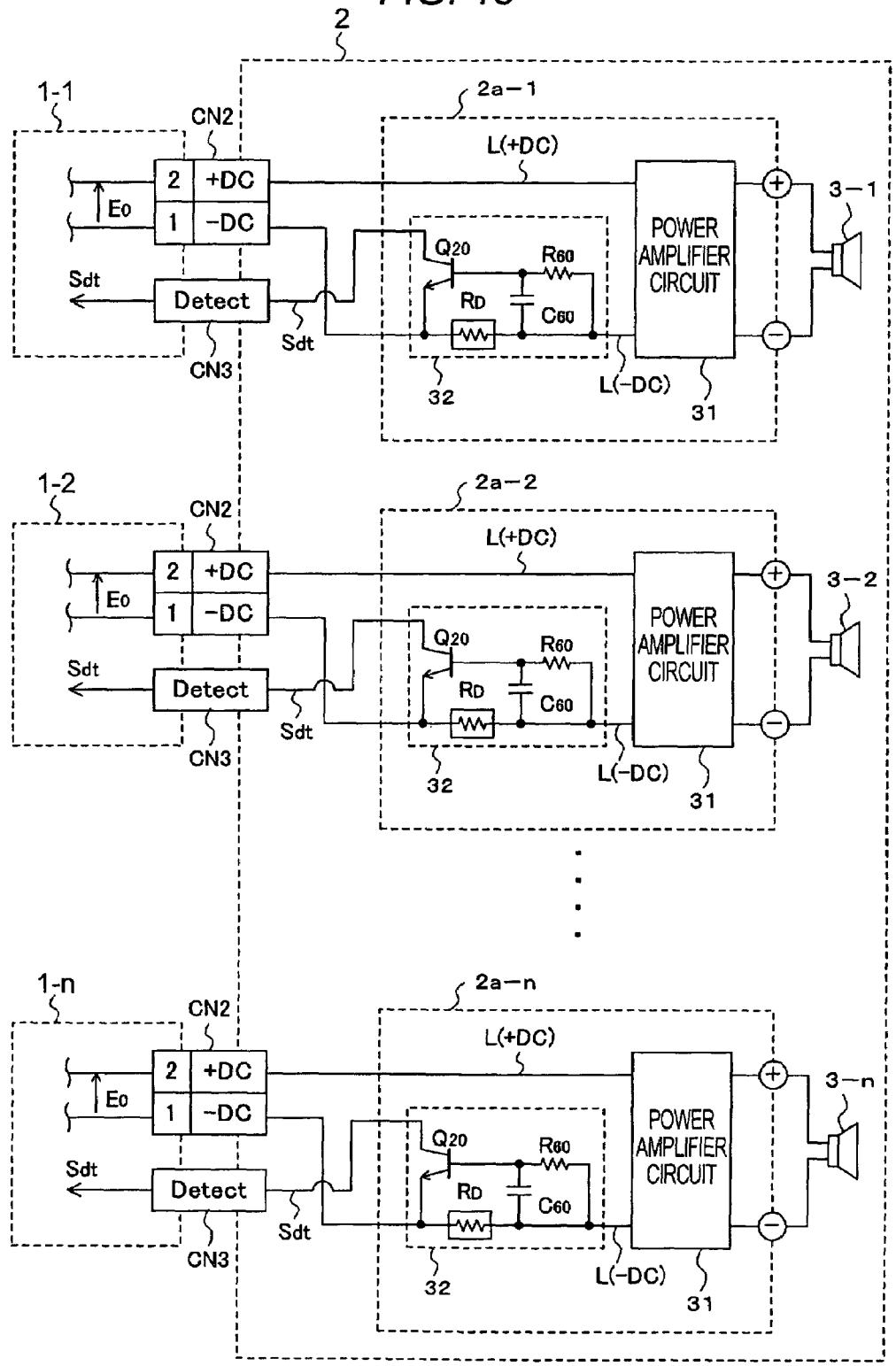
FIG. 15 is a circuit diagram showing the structure of a power amplifier apparatus according to another modification of the present invention.

FIG. 15 shows another modification and illustrates the entire power amplifier apparatus including the power-supply circuit section 1 and the power amplifier system section 2. In FIG. 15, the same parts as in FIG. 1 are referred to with the same reference numerals and the descriptions of these same parts will be omitted here.

Referring to FIG. 15, a plurality of power-supply circuit sections including a first power-supply circuit section 1-1 to an n-th power-supply circuit section 1-n is provided so as to correspond to the first power amplifier unit 2a-1 to the n-th power amplifier unit 2a-n in the power amplifier system section 2. In other words, in this case, the power-supply circuit sections from the first power-supply circuit section 1-1 to the n-th power-supply circuit section 1-n correspond to the power amplifier units from the first power amplifier unit 2a-1 to the n-th power amplifier unit 2a-n in a 1:1 relationship.

In this case, since the power supply units 1-1 to 1-n are connected in parallel to the common input connector CN1, a DC voltage supplied from the input connector CN1 branches off and is input to the first power-supply circuit section 1-1 to the n-th power-supply circuit section 1-n.

In addition, the internal structure of each of the first power-supply circuit section 1-1 to the n-th power-supply circuit section 1-n is similar to that of the power-supply circuit section 1 shown in FIG. 1.

With this structure, the first power-supply circuit section 1-1 supplies power only to the power amplifier circuit 31 of the first power amplifier unit 2a-1. Similarly, the second power-supply circuit section 1-2 to the n-th power-supply circuit section 1-n supply power only to the corresponding power amplifier circuits 31 of the second power amplifier unit 2a-2 to the n-th power amplifier unit 2a-n, respectively.

In addition, for example, a current-detecting signal Sdt output from the current-detecting circuit 32 of the first power amplifier unit 2a-1 is input to the protection circuit 12 included in the first power-supply circuit section 1-1. Similarly, current-detecting signals Sdt output from the current-detecting circuits 32 of the second power amplifier unit 2a-2 to the n-th power amplifier unit 2a-n are input to the protection circuits 12 included in the second power-supply circuit section 1-2 to the n-th power-supply circuit section 1-n, respectively.

With this structure, for example, the first power-supply circuit section 1-1 supplies power only to the power amplifier circuit 31 of the first power amplifier unit 2a-1 as a load, and the amount of power output to the power amplifier circuit 31 is controlled in accordance with only the load condition of the power amplifier circuit 31 of the first power amplifier unit 2a-1.

Similarly, the second power-supply circuit section 1-2 to the n-th power-supply circuit section 1-n supply power only to the power amplifier circuits 31 of the second power amplifier unit 2a-2 to the n-th power amplifier unit 2a-2, respectively, as loads. The second power-supply circuit section 1-2 to the n-th power-supply circuit section 1-n control the amount of power output to the power amplifier circuits 31 in accordance with only the load conditions of the power amplifier circuits 31 of the second power amplifier unit 2a-2 to the n-th power amplifier unit 2a-n, respectively.

With the structure shown in FIG. 1, the power-supply circuit section 1 supplies power to the power amplifier circuits 31 of the power amplifier units from the first power amplifier unit 2a-1 to the n-th power amplifier unit 2a-n, and power control on the power amplifier circuits 31 is performed in accordance with a current-detecting signal Sdt obtained by combining detection outputs from the power amplifier units from the first power amplifier unit 2a-1 to the n-th amplifier unit 2a-n. Thus, the power-supply circuit section 1 controls the amount of output power for all the power amplifier units from the first power amplifier unit 2a-1 to the n-th power amplifier unit 2a-n.

In contrast, with the structure shown in FIG. 15, for example, the first power-supply circuit section 1-1, which supplies power to the first power amplifier unit 2a-1, controls power supplied to the power amplifier circuit 31 of the first power amplifier unit 2a-1. In other words, the amount of power output to the power amplifier circuit 31 of a power amplifier unit is controlled independently by a corresponding power-supply circuit section.

Thus, the power amplifier system section 2 obtains a proper amount of output power for the power amplifier circuit 31 of each of the first power amplifier unit 2a-1 to the n-th power amplifier unit 2a-n in accordance with the corresponding load condition. This means that a proper amount of power is supplied to the power amplifier circuit 31 corresponding to each audio channel in accordance with the load condition of the power amplifier circuit 31. Thus, the structure shown in FIG. 15 has a higher performance compared with the structure shown in FIG. 1 in terms of controlling the amount of power in a multichannel-compatible power amplifier system. However, the structure shown in FIG. 1 is economically advantageous in that only one power supply circuit section is used while a sufficient effect of controlling the amount of power is achieved.

In the structure shown in FIG. 15, the current-detecting circuit 32 may be arranged as in FIG. 14.

In addition, in the above description, the operational amplifiers OP1, OP2, and OP10 in the protection circuit 12 operate as comparators, that is, logical circuits (digital circuits). However, in this modification, the operational amplifiers OP1, OP2, and OP10 may perform normal analog amplification with linear characteristics, as an output response to an input signal.

In this case, since a time constant determined by the time-constant circuit 21 sets a response delay time as a standby time Tw, outputting using peak power for a short time can be ensured.

As described with reference to FIGS. 7 to 10, since amplifier circuits including operational amplifiers for which different threshold voltage levels (time constants) are set are provided, the amount of output power can be controlled in a plurality of stages. The number of stages is not limited to two, and more than two stages may be set.

In addition, the staged control is not limited to a case where the amount of restriction of output power gradually changes. For example, the amount of restriction of output power may be changed within a range of a predetermined number of stages, and the operation of a power supply circuit may be stopped for the purpose of protection when the number of stages exceeds the predetermined number.

In addition, the structure of the power supply circuit and the protection circuit 12 are not limited to the foregoing structures. The structure of the power supply circuit and the protection circuit 12 may be changed in an appropriate fashion. For example, although, as a power supply circuit, controlling the switching frequency controls the amount of output power in the foregoing description, the other control procedures may be adopted. In addition, a power supply circuit is not limited to a switching power supply circuit.

Furthermore, a circuit functioning as a load of a power supply circuit is not limited to the power amplifier system section 2. A circuit that is, if temporarily, desired to be supplied with power corresponding to the maximum load or that is required to be supplied with power corresponding to the maximum load and that includes a plurality of circuit units functioning as loads may be used as a circuit functioning as a load. In accordance with this, a structure for detecting load power in the plurality of load circuit units is not limited to the structure of the current-detecting circuit 32, and the other structures may be adopted.

It should be understood by those skilled in the art that various modifications, combinations, sub-combinations and alterations may occur depending on design requirements and other factors insofar as they are within the scope of the appended claims or the equivalents thereof.

What is claimed is:

1. A multi-channel audio circuit comprising:
   first and second detection circuits that are provided so as to respectively correspond to first and second load circuits wherein the first detection circuit detects an overcurrent condition of a load current of the first load circuit and provides a first detection output indicative of said overcurrent condition and the second detection circuit detects an overcurrent condition of a load current of the second load circuit and provides a second detection output indicative of said overcurrent condition; and
   first and second power supply circuits connected in parallel to a common voltage input and respectively corresponding to first and second audio channels, wherein the first load circuit performs an operation using power output from the first power supply circuit and the second load circuit performs an operation using power output from the second power supply circuit, and wherein an amount of power output to the first and second load circuits is independently controlled by the first and second power supply circuits, respectively;
   wherein each of the first and second power supply circuits comprises a control unit that receives the corresponding first or second detection output and controls a transformer of the power supply circuit so as to change an amount of power output from the power supply circuit in accordance with the detection output.

2. The multi-channel audio circuit according to claim 1, wherein:
   the control unit determines a control time by a predetermined time constant in accordance with the detection outputs of the detection circuits; and
   the control unit controls the predetermined operation of the power supply circuit so as to change the amount of power output in accordance with the determined control time.

3. A multi-channel audio circuit comprising:
   first and second detection circuits that are provided so as to respectively correspond to first and second load circuits that perform operations using power output from first and second power supply circuits, respectively, wherein the first and second power supply circuits are connected in parallel to a common voltage input and respectively correspond to first and second audio channels, and wherein each of the first and second detection circuits detects an overcurrent condition of a load current of the corresponding load circuit and provides a corresponding detection output indicative of said overcurrent condition; and
   wherein an amount of power output to the first and second load circuits is independently controlled by the first and second power supply circuits, respectively.

4. The power supply controller of claim 1, wherein the control unit varies an amount of power transmitted from a primary side of the transformer to a secondary side of the transformer.

5. The method of claim 3, wherein each of the first and second power supply circuits comprises a control unit that receives the corresponding detection output and controls a transformer of the power supply circuit so as to change an amount of power output from the power supply circuit in accordance with the detection output.

* * * * *